US012684989B2

(12) United States Patent
　　Bok

(10) Patent No.:　US 12,684,989 B2
(45) Date of Patent:　　　Jul. 14, 2026

(54) DISPLAY DEVICE

(71) Applicant: SAMSUNG DISPLAY CO., LTD.,
　　　　　　　Yongin-si (KR)

(72) Inventor: Seung-Lyong Bok, Yongin-si (KR)

(73) Assignee: SAMSUNG DISPLAY CO., LTD.,
　　　　　　　Yongin-si (KR)

( * ) Notice: Subject to any disclaimer, the term of this
　　　　　　patent is extended or adjusted under 35
　　　　　　U.S.C. 154(b) by 0 days.

(21) Appl. No.: 18/802,434

(22) Filed: Aug. 13, 2024

(65) Prior Publication Data

US 2025/0169324 A1　　May 22, 2025

(30) Foreign Application Priority Data

Nov. 22, 2023　(KR) ......................... 10-2023-0162876
　Feb. 2, 2024　(KR) ......................... 10-2024-0016893

(51) Int. Cl.
　　*H10K 59/40*　　　　(2023.01)
　　*G06F 3/044*　　　　(2006.01)
　　*H10K 59/122*　　　(2023.01)
　　*H10K 59/131*　　　(2023.01)
　　*H10K 59/88*　　　　(2023.01)
(52) U.S. Cl.
　　CPC ........... *H10K 59/40* (2023.02); *G06F 3/0443*
　　　　　(2019.05); *G06F 3/0446* (2019.05); *H10K*
　　　　　*59/122* (2023.02); *H10K 59/131* (2023.02);
　　　　　　　　　　　　　*H10K 59/88* (2023.02)
(58) Field of Classification Search
　　CPC .... H10K 59/40; H10K 59/122; H10K 59/131;
　　　　　H10K 59/88; G06F 3/0443; G06F 3/0446;
　　　　　G06F 2203/04111; G06F 3/0412; G06F
　　　　　　　　　　　　　　　　2203/04112
　　See application file for complete search history.

(56) References Cited

U.S. PATENT DOCUMENTS

| | | | |
|---|---|---|---|
| 9,997,729 B2 * | 6/2018 | Chae ..................... | G06F 3/0445 |
| 10,620,732 B2 | 4/2020 | Oh et al. | |
| 10,732,762 B2 | 8/2020 | Na et al. | |
| 10,777,621 B2 * | 9/2020 | Lee ......................... | H10K 59/40 |
| 11,861,126 B2 | 1/2024 | Bok et al. | |

(Continued)

FOREIGN PATENT DOCUMENTS

| KR | 10-2023-0108771 A | 7/2023 |
|---|---|---|
| KR | 10-2572330 B1 | 8/2023 |

*Primary Examiner* — Amy Onyekaba
(74) *Attorney, Agent, or Firm* — F. CHAU &
ASSOCIATES, LLC

(57) ABSTRACT

A display device including: a display panel including first
and second light emitting elements alternately arranged in a
first direction in odd-numbered columns, and third light
emitting elements arranged in the first direction in even-
numbered columns; and sensing parts disposed on the dis-
play panel, wherein each of the sensing parts includes: a
plurality of mesh lines between an n-th first light emitting
element and an n-th second light emitting element, between
the n-th first light emitting element and an n-th third light
emitting element, and between the n-th second light emitting
element and the n-th third light emitting element, when
viewed in a plan view; and conductive patterns interposed
between the third light emitting elements arranged in one
even-numbered column, when viewed in the plan view, and
wherein each of the conductive patterns has a width greater
than a width of each of the mesh lines.

21 Claims, 28 Drawing Sheets

(56) References Cited

U.S. PATENT DOCUMENTS

| | | | |
|---|---|---|---|
| 2019/0371865 A1* | 12/2019 | Lee | H10K 59/8791 |
| 2021/0225970 A1* | 7/2021 | Ryu | H10K 59/353 |
| 2023/0180534 A1* | 6/2023 | Ryu | H10K 59/353 |
| | | | 257/40 |

* cited by examiner

DD

DP

ELm     SLm     CNL

DA

NDA

PL1

PL2

SDV

DL1          DLn

EDV

SL1     EL1

PX

CSL1

CSL2

DDV     PD1

DR1

DR2

DR3

PDL LEA    PL2' CH3 LEA    PL2'

NLEA

LEA

PX2(OLED2)

AE2
AE3
PX3(OLED3)
AE1
PX1(OLED1)

CH

DR1
DDR2    DDR1
DR2
DR3

Figure 24:
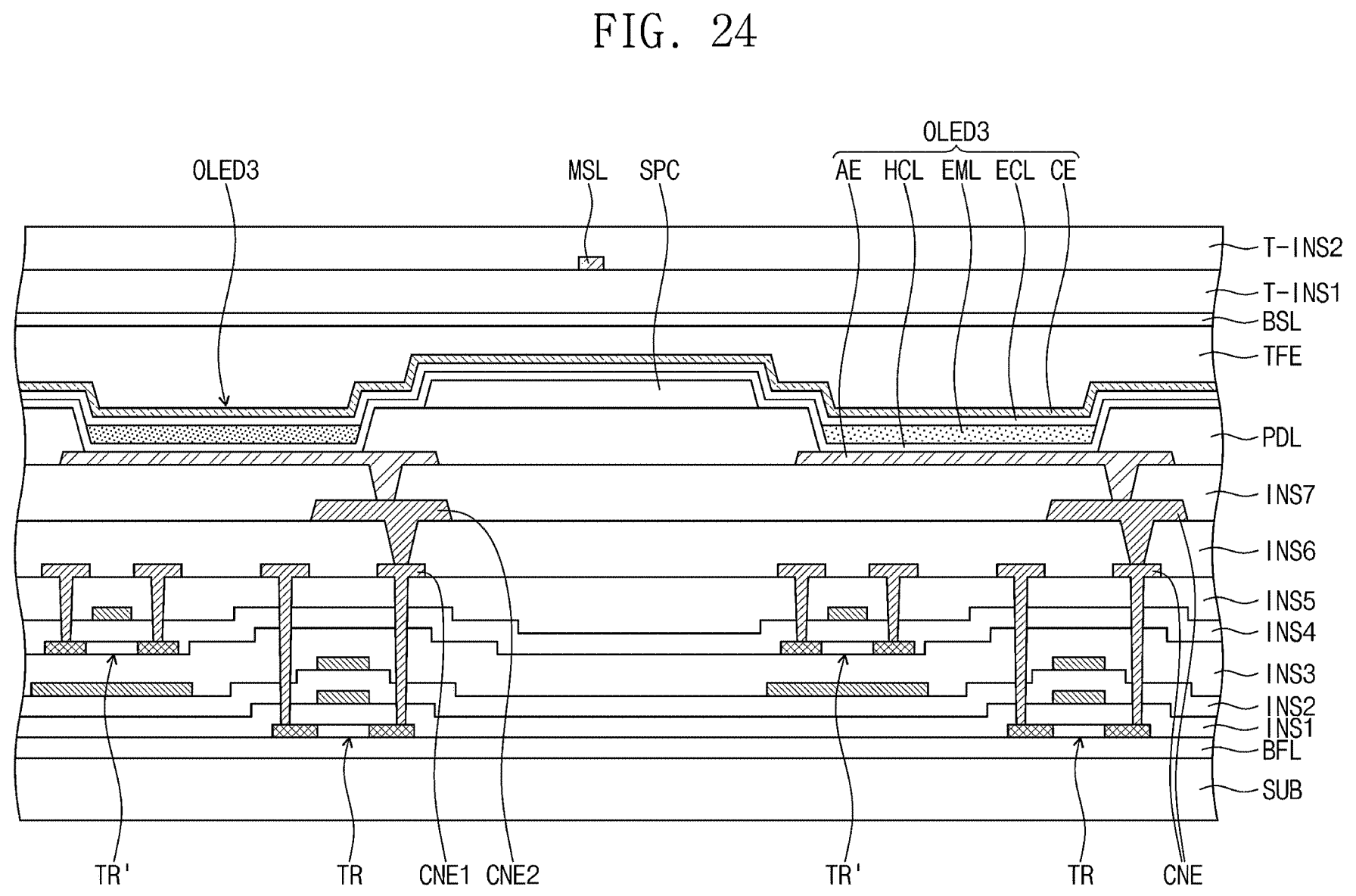

T-INS2
T-INS1
BSL
TFE
PDL
INS7
INS6
INS5
INS4
INS3
INS2
INS1
BFL
SUB

CNE

OLED3

AE HCL EML ECL CE

TR

MSL  SPC

TR'

OLED3

CNE1 CNE2

TR

TR'

DISPLAY DEVICE

CROSS-REFERENCE TO RELATED APPLICATIONS

This application claims priority under 35 U.S.C. § 119 to Korean Patent Application Nos. 10-2023-0162876 and 10-2024-0016893 filed on Nov. 22, 2023 and Feb. 2, 2024, in the Korean Intellectual Property Office, the disclosures of which are incorporated by reference herein in their entireties.

TECHNICAL FIELD

Embodiments of the present disclosure described herein relate to a display device.

DISCUSSION OF RELATED ART

In general, electronic devices such as smartphones, digital cameras, laptops, navigation systems, or smart televisions, which provides images to users, include display devices to display those images. The display device generates an image and then presents it to the user through a display screen.

The display device includes a display panel to generate the image and an input sensing part disposed on the display panel to detect external inputs. The input sensing part detects user touch, which serves as the external input. The input sensing part includes a plurality of sensing parts to sense the external input.

A capacitance is formed by the sensing parts, and variations in the capacitance are detected when the user touches the input sensing part. Technology has been developed to enhance the touch sensitivity of the input sensing part, making it easier to detect user touches.

SUMMARY

Embodiments of the present disclosure provide a display device that can enhance the touch sensitivity of its input sensing part.

According to an embodiment of the present disclosure, there is provided a display device including: a display panel including a plurality of first light emitting elements and a plurality of second light emitting elements alternately arranged in a first direction in odd-numbered columns, and a plurality of third light emitting elements arranged in the first direction in even-numbered columns; and a plurality of sensing parts disposed on the display panel, wherein each of the plurality of sensing parts includes: a plurality of mesh lines interposed between an n-th first light emitting element and an n-th second light emitting element, between the n-th first light emitting element and an n-th third light emitting element, and between the n-th second light emitting element and the n-th third light emitting element, when viewed in a plan view, wherein 'n' is a natural number; and a plurality of conductive patterns interposed between the third light emitting elements arranged in one even-numbered column, when viewed in the plan view, and wherein each of the conductive patterns has a width greater than a width of each of the mesh lines.

According to an embodiment of the present disclosure, there is provided a display device including: a display panel including a plurality of first light emitting elements and second light emitting elements alternately arranged in a h-th column, and a plurality of third light emitting elements arranged in a (h+1)-th column; and a plurality of sensing parts disposed on the display panel, wherein each of the plurality of sensing parts includes: a plurality of mesh lines interposed between an n-th first light emitting element and an n-th second light emitting element, between the n-th first light emitting element and an n-th third light emitting element, and between the n-th second light emitting element and the n-th third light emitting element, when viewed on a plane; and a plurality of conductive patterns interposed between the third light emitting elements, when viewed on the plane, and wherein each of the conductive patterns has a width greater than a width of each of the mesh lines, wherein some mesh lines of the mesh lines are cut out, and wherein each of 'h' and 'n' is a natural number.

BRIEF DESCRIPTION OF THE DRAWINGS

The above and other features of the present disclosure will become apparent by describing in detail embodiments thereof with reference to the accompanying drawings.

FIG. 21 is a cross-sectional view schematically illustrating any one contact hole illustrated in FIG. 20 and two third light emitting elements adjacent to the any one contact hole.

FIG. 22 is a view illustrating a connection configuration between an auxiliary line and a common electrode according to another embodiment of the present disclosure.

3

Figure 23:
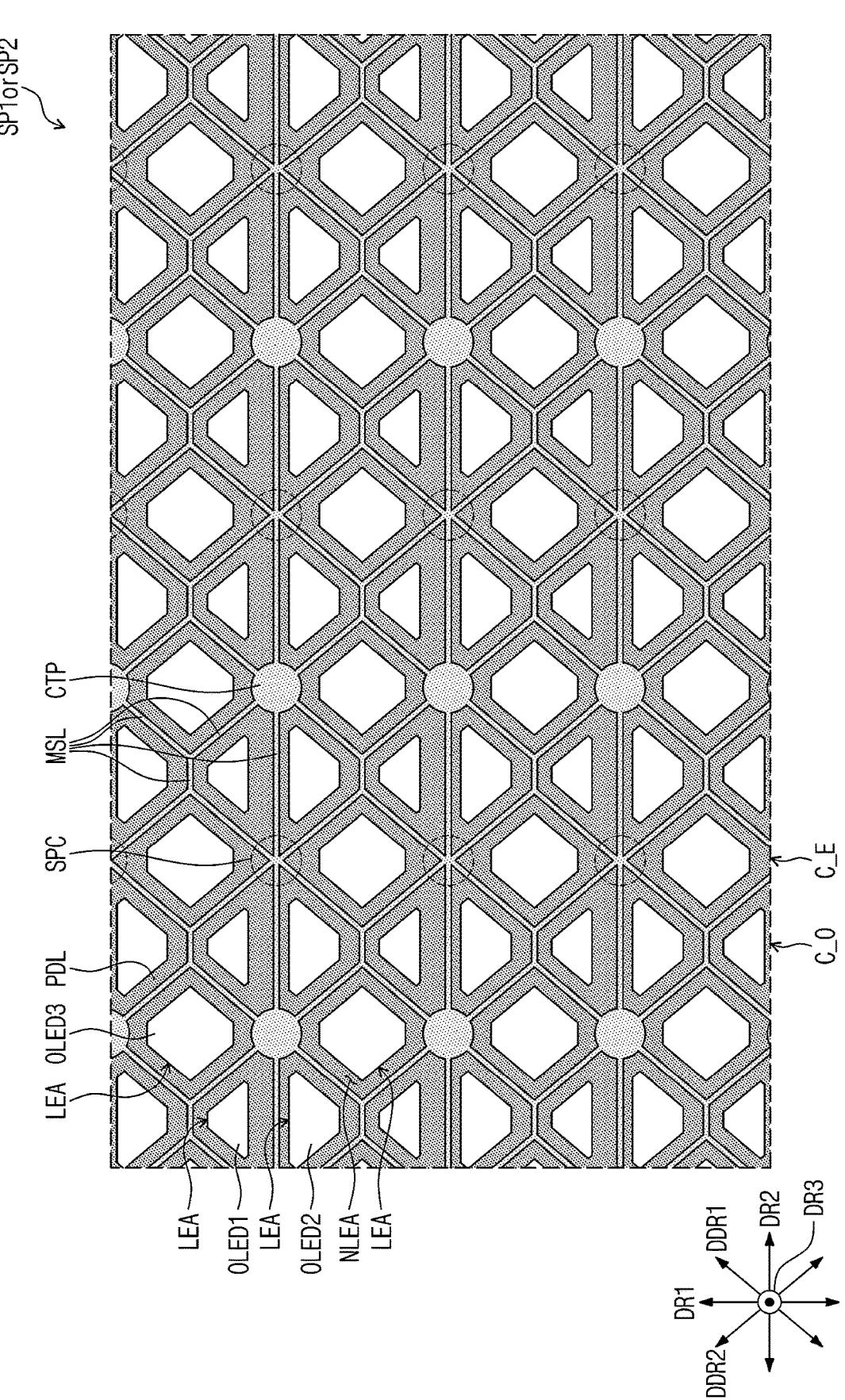
FIG. 23 is a view illustrating a structure of a display panel including a spacer according to another embodiment of the present disclosure.

FIG. 24 is a cross-sectional view schematically illustrating any one spacer and third light emitting elements disposed with a spacer interposed therebetween in FIG. 23.

Figure 25:
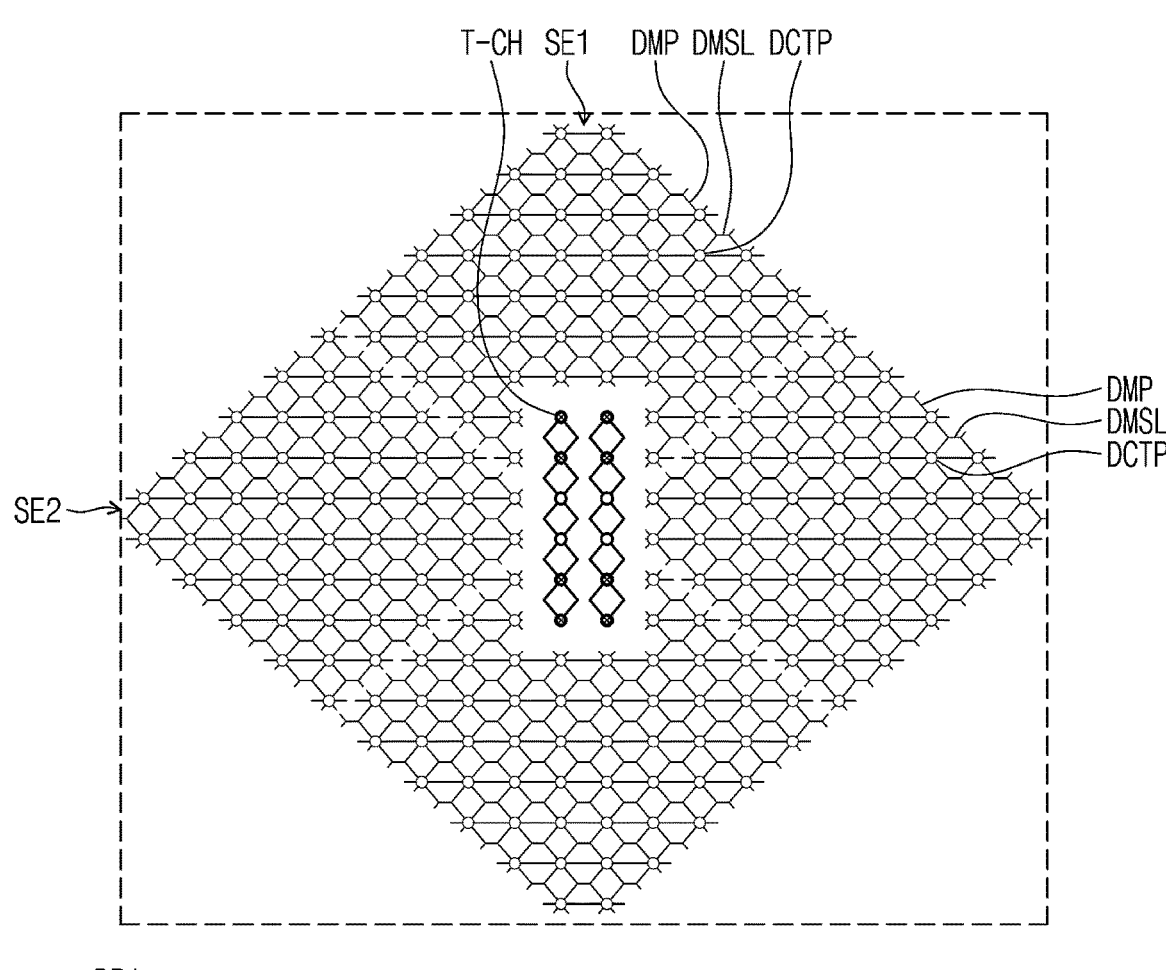
Figure 25:
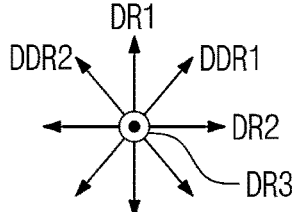
Figure 26:
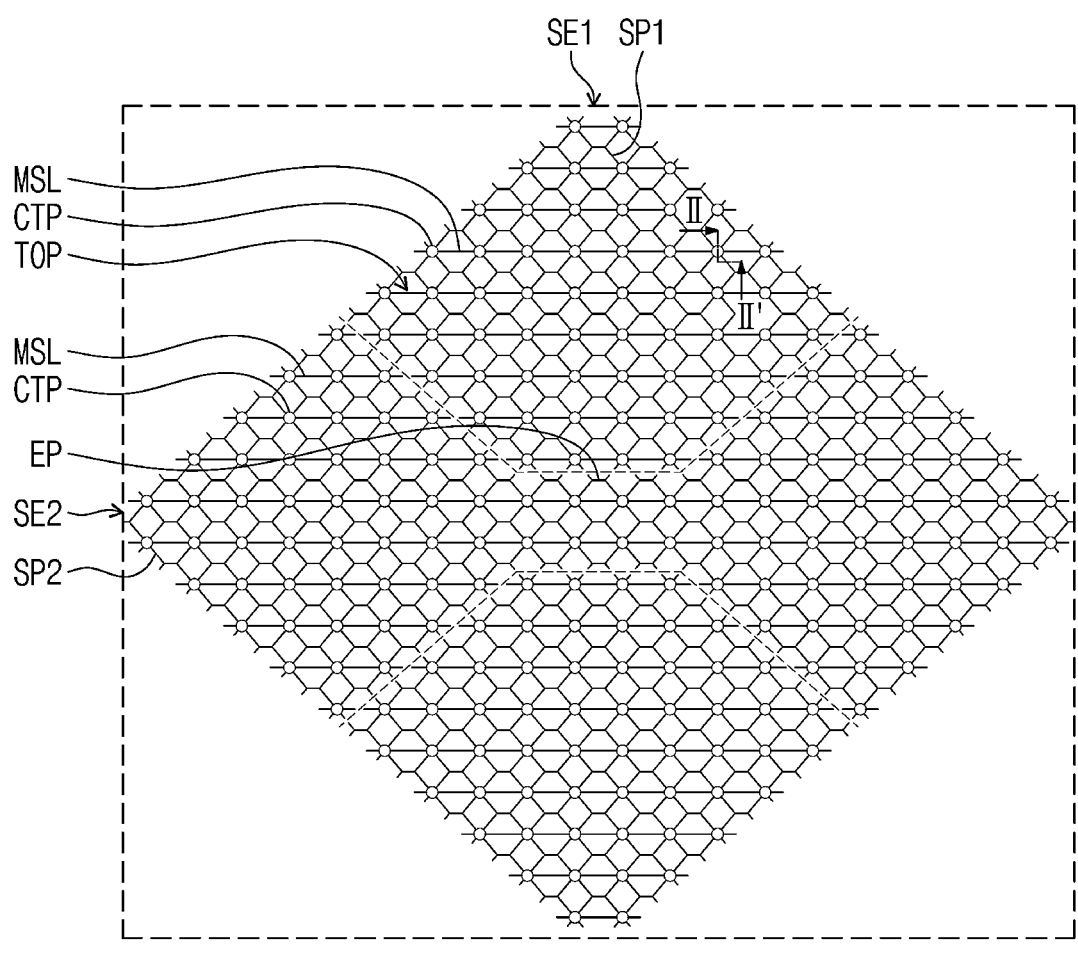
Figure 26:
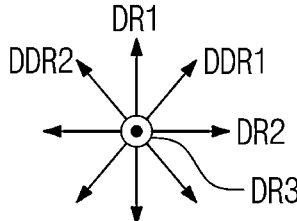

FIGS. 25 and 26 are views illustrating a planar configuration of first and second sensing electrodes according to another embodiment of the present disclosure.

Figure 27:
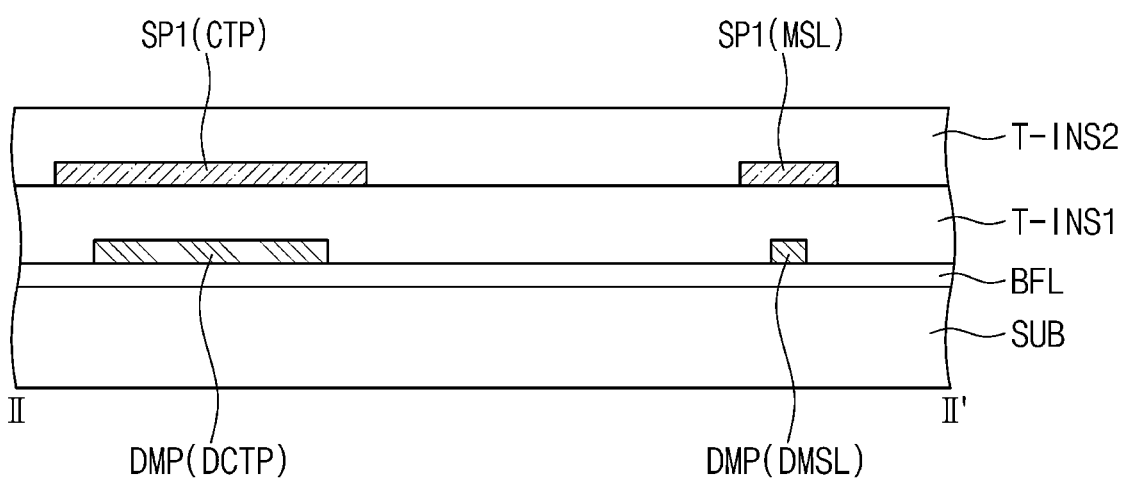

FIG. 27 is a cross-sectional view taken along line II-II' illustrated in FIG. 26.

Figure 28A:
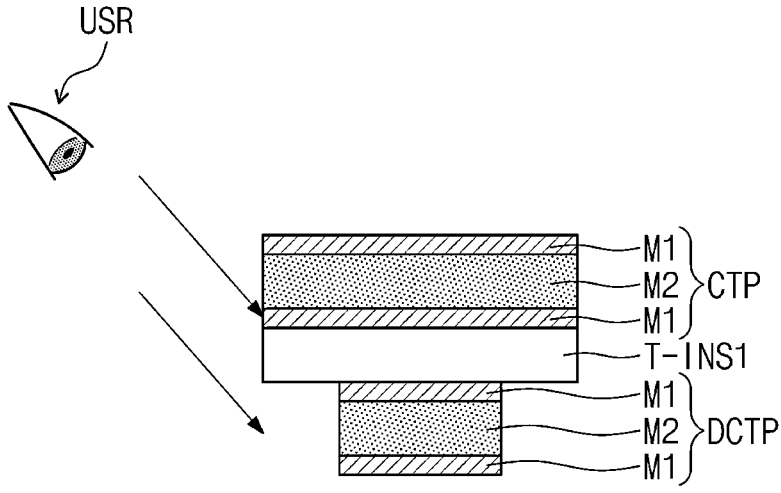

FIG. 28A is a cross-sectional view illustrating a conductive pattern and a dummy conductive pattern in FIG. 27 in more detail.

Figure 28B:
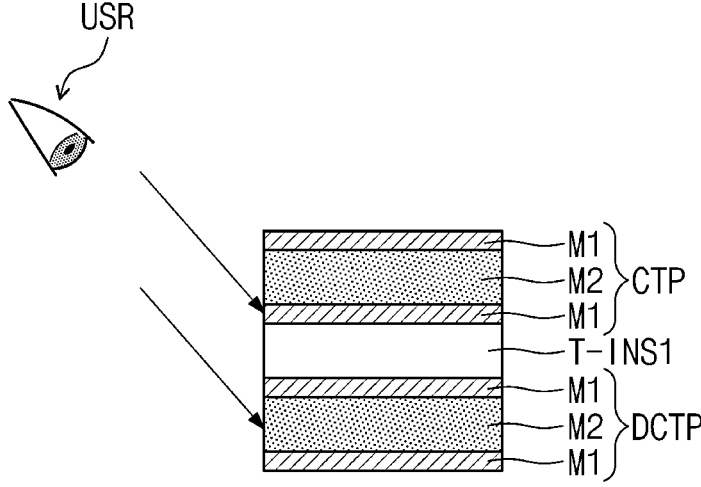

FIG. 28B is a view illustrating a configuration in which a conductive pattern and a dummy conductive pattern have the same width in FIG. 27.

DETAILED DESCRIPTION OF THE EMBODIMENTS

In the specification, the expression that a first component (or region, layer, part, portion, etc.) is "on", "connected to", or "coupled to" a second component may mean that the first component is directly on, connected to, or coupled to the second component or that a third component is interposed therebetween.

The same reference numeral may be assigned to the same component, in this specification. In addition, in drawings, thicknesses, proportions, and dimensions of components may be exaggerated.

The term "and/or" includes any and all combinations of one or more of associated components.

Although the terms "first", "second", etc. may be used to describe various components, the components should not be construed as being limited by the terms. The terms are used to distinguish one component from another component. For example, a first component may be referred to as a second component, and similarly, the second component may be referred to as the first component. Singular forms are intended to include the plural forms unless the context clearly indicates otherwise.

In addition, the terms "under", "at a lower portion", "above", "an upper portion" are used to describe the relationship between components illustrated in drawings. The terms are relative and are described with reference to a direction indicated in the drawing.

Unless otherwise defined, all terms (including technical terms and scientific terms) used in the specification have the same meaning as commonly understood by one skilled in the art to which the present disclosure belongs. Furthermore, terms defined in commonly used dictionaries should be interpreted as having meanings consistent with their context in the related technology, and should not be interpreted in ideal or overly formal ways unless explicitly defined herein.

It will be further understood that the terms "comprises," "comprising," "includes," "including," or "having" specify the presence of the stated features, numbers, steps, operations, components, parts, or combination thereof, but do not preclude the presence or addition of one or more other features, numbers, steps, operations, components, and/or combinations thereof.

Hereinafter, embodiments of the present disclosure will be described with reference to the accompanying drawings.

Figure 1:
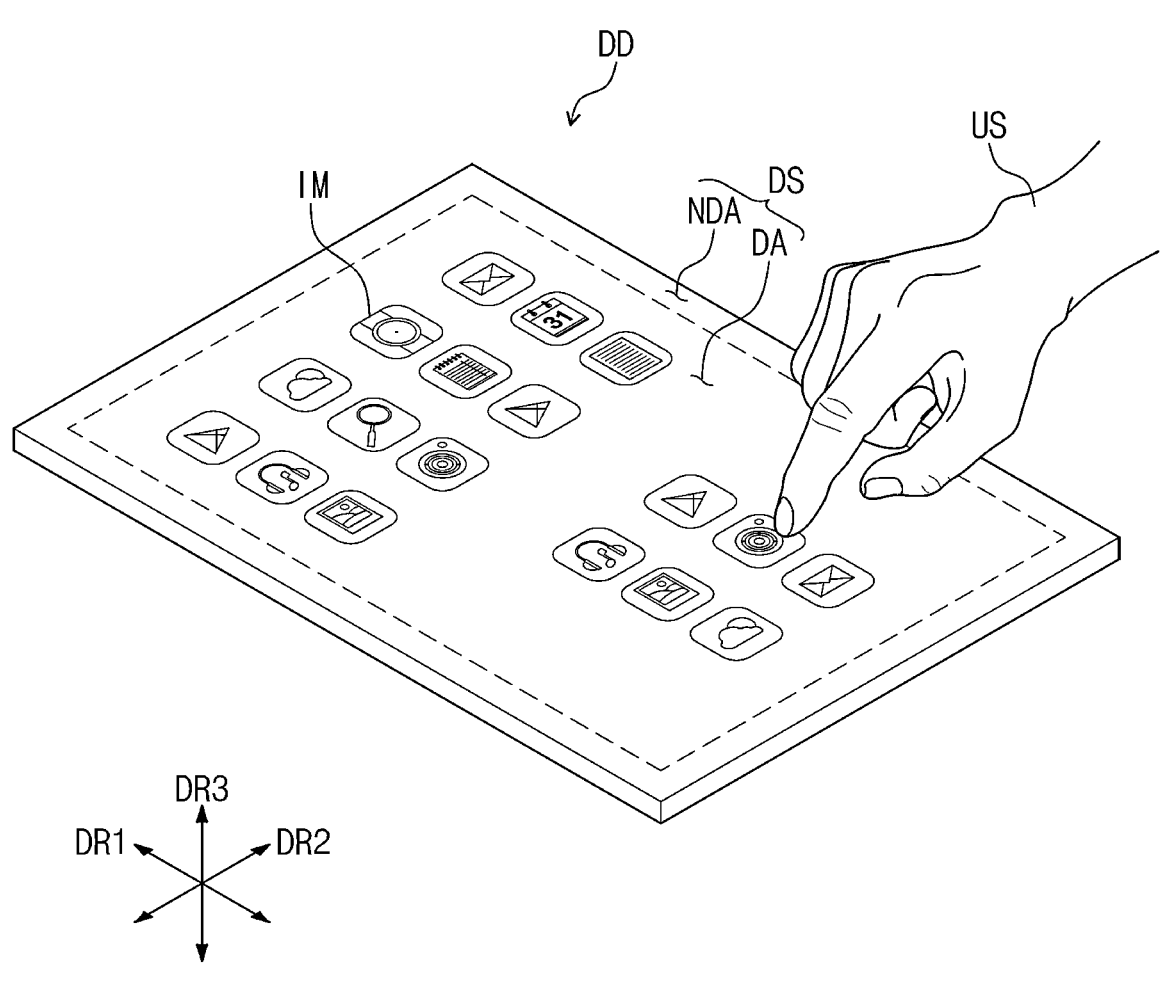
FIG. 1 is a perspective view of a display device according to an embodiment of the present disclosure.

FIG. 1 is a perspective view of a display device according to an embodiment of the present disclosure.

Referring to FIG. 1, according to an embodiment of the present disclosure, a display device DD may have a shape of a rectangle having a longer side extending in a first direction DR1, and a shorter side extending in a second direction DR2 crossing the first direction DR1. However, an embodiment is not limited thereto, and the display device DD may have various shapes such as a circle or a polygon. The first direction DR1 and the second direction DR2 are substantially perpendicular to each other while crossing each other.

Hereinafter, a direction substantially perpendicular to a plane defined by the first direction DR1 and the second direction DR2 is a third direction DR3. In the specification, the meaning of "when viewed in a plan view" may mean "when viewed in the third direction DR3".

A top surface of the display device DD may be referred to as a display surface DS and may have the plane defined by the first direction DR1 and the second direction DR2. Images IM generated by the display device DD may be provided to a user US through the display surface DS.

The display surface DS may include a display region DA and a non-display region NDA around the display region DA. The display region DA is intended to display an image, while the non-display region NDA does not display the image. The non-display region NDA may be an edge of the display device DD that surrounds the display region DA and is printed with a specific color.

The display device DD may be used for a large electronic device such as a television, a monitor, or an outer billboard. In addition, the display device DD may be used for small and medium display devices such as a personal computer, a laptop computer, a personal digital terminal, a car navigation system, a game console, a smartphone, a tablet, or a camera. However, the type of the display device DD is provided for illustrative purposes only. The display device DD may be applied to other electronic devices as long as it does not deviate from the concept of the present disclosure.

Figure 2:
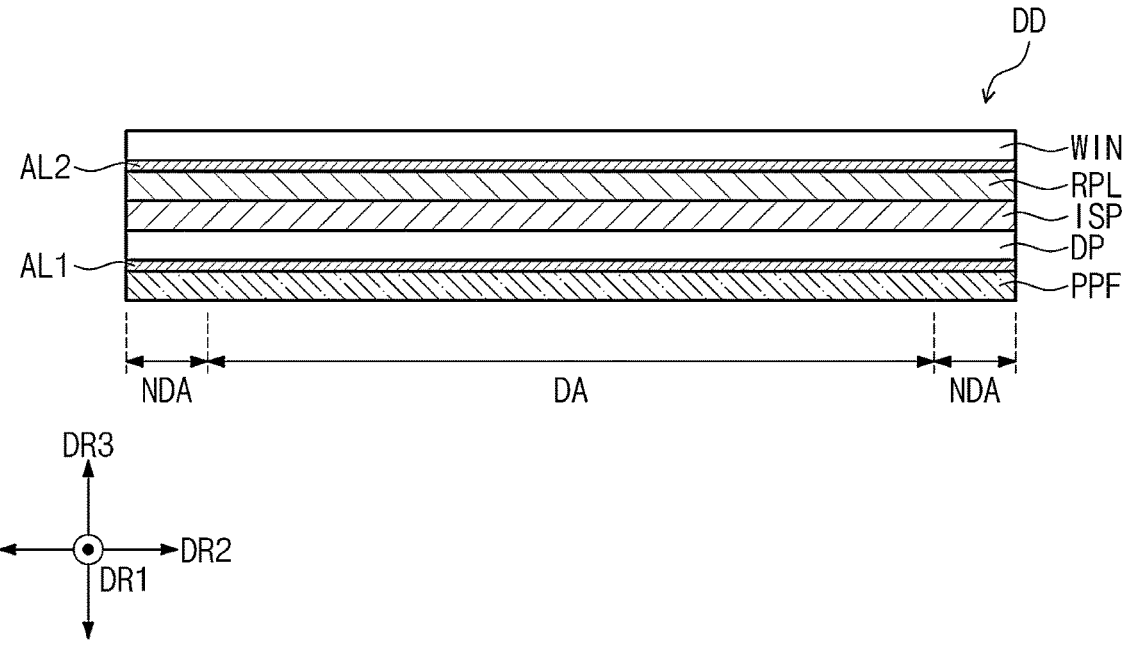
FIG. 2 is a cross-sectional view of a display device illustrated in FIG. 1.

FIG. 2 is a cross-sectional view of a display device illustrated in FIG. 1.

For example, FIG. 2 illustrates a cross-sectional view of the display device DD when viewed in the first direction DR1.

Referring to FIG. 2, the display device DD may include a display panel DP, an input sensing part ISP, an anti-reflective layer RPL, a window WIN, a panel protecting film PPF, and first and second adhesive layers AL1 and AL2.

According to an embodiment of the present disclosure, the display panel DP may be an emissive-display panel. For example, the display panel DP may be an organic light emitting display panel or an inorganic light emitting display panel. A light emitting layer of the organic light emitting display panel may include an organic light emitting material. The light emitting layer of the inorganic light emitting display panel may include a quantum dot, or a quantum rod. Hereinafter, the display panel DP is an organic light emitting display panel.

The input sensing part ISP may be disposed on the display panel DP. The input sensing part ISP may include a plurality of sensing parts to sense an external input in a capacitive manner. The input sensing unit ISP may be directly formed on the display panel DP when manufacturing the display device DD. However, the present disclosure is not limited thereto. The input sensing part ISP may be manufactured separately from the display panel DP, and attached to the display panel DP by an adhesive layer.

The anti-reflective layer RPL may be disposed on the input sensing part ISP. The anti-reflective layer RPL may be disposed on the input sensing part ISP, when the display device DD is manufactured. However, the present disclosure is not limited thereto. The anti-reflective layer RPL may be manufactured using an additional panel and attached to the input sensing part ISP through an adhesive layer.

The anti-reflective layer RPL may be a film that prevents external light from being reflected. The anti-reflective layer RPL may reduce the reflectance of external light incident from the top surface of the display device DD toward the display panel DP. As a result, the external light may not be visible to the user due to the anti-reflective layer RPL.

When external light directed toward the display panel DP is reflected back to the user, it can create a mirror-like effect, allowing the user to see the external light. To prevent this phenomenon, the anti-reflective layer RPL may include a plurality of color filters that display the same color as the pixels of the display panel DP.

The color filters may filter the external light to match the color of the pixels. In this case, the external light may not be visible to the user. However, the present disclosure is not limited thereto. For example, the anti-reflective layer RPL may include a phase retarder and/or a polarizer, to reduce the reflective index of the external light.

The window WIN may be disposed on the anti-reflective layer RPL. The window WIN may protect the display panel DP, the input sensing unit ISP, and the anti-reflective layer RPL from external scratches and impacts.

The panel protecting film PPF may be disposed under the display panel DP. The panel protecting film PPF may protect a lower part of the display panel DP. The panel protecting film PPF may include a flexible plastic material such as Polyethyleneterephthalate (PET).

The first adhesive layer AL1 may be interposed between the display panel DP and the panel protecting film PPF. For example, the display panel DP and the panel protecting film PPF may be combined with each other by the first adhesive layer AL1. The second adhesive layer AL2 may be interposed between the window WIN and the anti-reflective layer RPL. For example, the window WIN and the anti-reflective layer RPL may be combined with each other by the second adhesive layer AL2.

Figure 3:
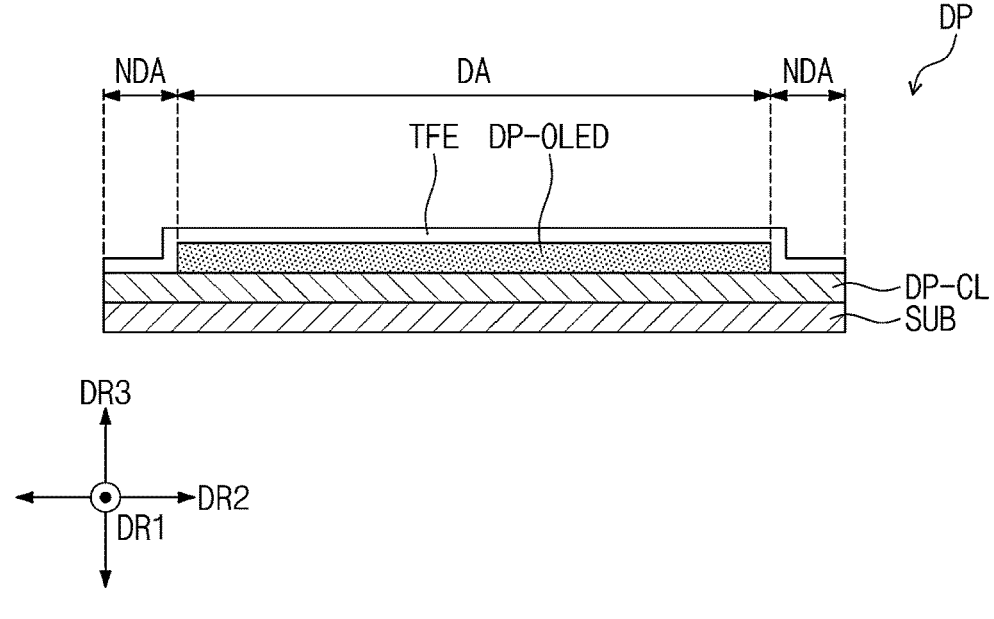
FIG. 3 is a cross-sectional view of a display panel illustrated in FIG. 2.

FIG. 3 is a cross-sectional view of a display panel illustrated in FIG. 2.

For example, FIG. 3 illustrates a cross-sectional view of the display panel DP when viewed in the first direction DR1.

Referring to FIG. 3, the display panel DP includes a substrate SUB, a circuit element layer DP-CL disposed on the substrate SUB, a display element layer DP-OLED disposed on the circuit element layer DP-CL, and a thin film encapsulation layer TFE disposed on the display element layer DP-OLED.

The substrate SUB may include the display region DA and the non-display region NDA around the display region DA. The substrate SUB may include a flexible plastic material such as glass or polymide (PI). The display element layer DP-OLED is disposed in the display region DA.

A plurality of pixels may be disposed on the circuit element layer DP-CL and the display element layer DP-OLED. Each of the pixels may include a transistor disposed in the circuit element layer DP-CL and a light emitting element disposed in the display element layer DP-OLED to be connected to the transistor.

The thin film encapsulation layer TFE may be disposed on the circuit element layer DP-CL to cover the display element layer DP-OLED. The thin film encapsulation layer TFE may protect pixels from moisture, oxygen, and external foreign substances.

Figure 4:
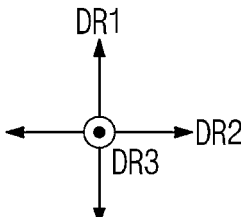
FIG. 4 is a plan view of a display panel illustrated in FIG. 2.

FIG. 4 is a plan view of a display panel illustrated in FIG. 2.

Referring to FIG. 4, the display device DD may include the display panel DP, a scan driver SDV, a data driver DDV, a light emission driver EDV, and a plurality of pads PD1.

Although the display panel DP may have the shape of a rectangle having a longer side extending in the first direction DR1 and a shorter side extending in the second direction DR2, the shape of the display panel DP is not limited thereto. The display panel DP may include the display region DA and the non-display region NDA surrounding the display region DA.

The display panel DP may include a plurality of pixels PX, a plurality of scan lines SL1 to SLm, a plurality of data lines DL1 to DLn, a plurality of light emitting lines EL1 to ELm, first and second control lines CSL1 and CSL2, first and second power supply lines PL1 and PL2, and connection lines CNL. In this case, 'm' and 'n' are natural numbers.

The pixels PX may be disposed in the display region DA. The scan driver SDV and the light emission driver EDV may be disposed in the non-display region NDA adjacent to the longer sides of the display panel DP, respectively. The data driver DDV may be disposed in the non-display region NDA adjacent to one of the shorter sides of the display panel DP. When viewed in a plan view, the data driver DDV may be adjacent to a lower end of the display panel DP.

The scan lines SL1 to SLm may extend in the second direction DR2 to be connected to the pixels PX and the scan driver SDV. The data lines DL1 to DLn may extend in the first direction DR1 to be connected to the pixels PX and the data driver DDV. The light emitting lines EL1 to ELm may extend in the second direction DR2 and be connected to the pixels PX and the light emission driver EDV.

The first power supply line PL1 may extend in the first direction DR1 and may be disposed in the non-display region NDA. The first power supply line PL1 may be interposed between the display region DA and the light emission driver EDV.

The connection lines CNL may extend in the second direction DR2, may be arranged in the first direction DR1, and be connected to the first power supply line PL1 and the pixels PX. A first voltage may be applied to the pixels PX through the first power supply line PL1 and the connection lines CNL connected to each other.

The second power supply line PL2 may be disposed in the non-display region NDA, and extend along the longer sides of the display panel DP as well as the shorter side of the display panel DP where the data driver DDV is not located. The second power supply line PL2 may be disposed outside the scan driver SDV and the light emission driver EDV. The second power supply line PL2 may be connected to the pixels PX. A second voltage having a level lower than the first voltage may be applied to the pixels PX through the second power supply line PL2.

The first control line CSL1 may be connected to the scan driver SDV, and extend toward the lower end portion of the display panel DP. The second control line CSL2 may be connected to the light emission driver EDV, and extend toward the lower end portion of the display panel DP. The data driver DDV may be interposed between the first control line CSL1 and the second control line CSL2.

The first pads PD1 may be disposed in the non-display region NDA adjacent to the lower end portion of the display panel DP, and positioned closer to the lower end portion of the display panel DP than the data driver DDV. The data driver DDV, the first power supply line PL1, the second power supply line PL2, the first control line CSL1, and the second control line CSL2 may be connected to the first pads PD1. The data lines DL1 to DLn may be connected to the data driver DDV, and the data driver DDV may be connected to the first pads PD1 corresponding to the data lines DL1 to DLn.

The display device DD may further include a timing controller to control the scan driver SDV, the data driver DDV, and the light emission driver EDV and a voltage generator to generate the first and second voltages. The timing controller and the voltage generator may be connected to the first pads PD1 through a printed circuit board.

The scan driver SDV may generate a plurality of scan signals, and the scan signals may be applied to the pixels PX through the scan lines SL1 to SLm. The data driver DDV may generate the plurality of data voltages. The data voltages may be applied to the pixels PX through the data lines DL1 to DLn. The light emission driver EDV may generate a plurality of light emitting signals, and the light emitting signals may be applied to the pixels PX through the light emitting lines EL1 to ELm.

The pixels PX may receive data voltages in response to the scan signals. The pixels PX may display the image by emitting light with brightness corresponding to the data voltages, in response to the light emitting signals.

Figure 5:
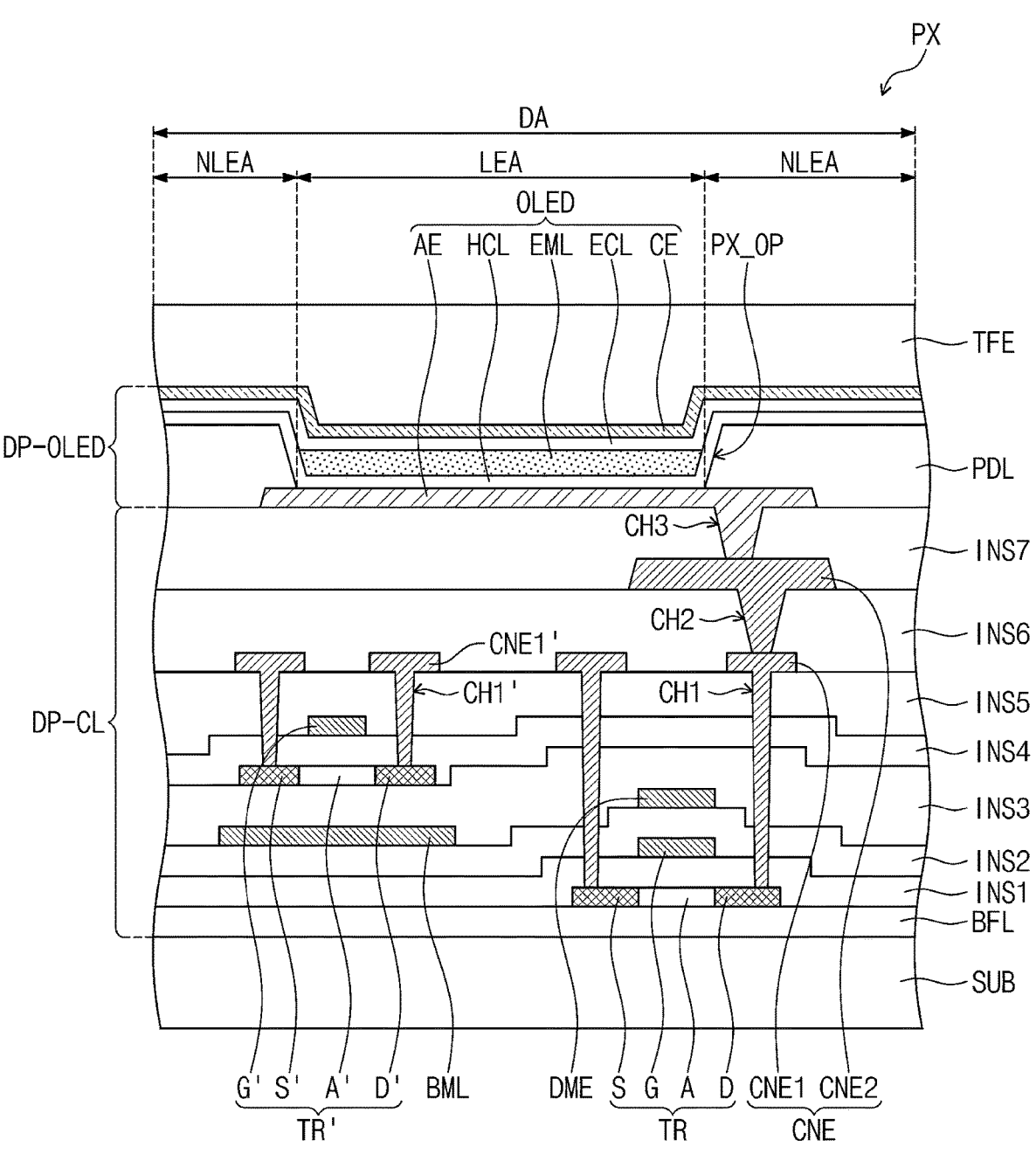
FIG. 5 is a cross-sectional view illustrating the configuration of any one pixel illustrated in FIG. 4.

FIG. 5 is a cross-sectional view illustrating the configuration of any one pixel illustrated in FIG. 4.

Referring to FIG. 5, the pixel PX may include a plurality of transistors TR and TR' and a light emitting element OLED. The transistors TR and TR' and the light emitting element OLED may be disposed on a substrate SUB. Although two transistors TR and TR' are illustrated, the pixel PX may include more than two transistors.

The display region DA may include a light emitting region LEA corresponding to the pixel PX and a non-light emitting region NLEA adjacent to the light emitting region LEA. The light emitting element OLED may be disposed in the light emitting region LEA.

A buffer layer BFL is disposed on the substrate SUB, and may be an inorganic layer. Semiconductor layers S, A, and D of the transistor TR may be disposed on the buffer layer BFL. The semiconductor layers S, A, and D may include polysilicon. However, the present disclosure is not limited thereto, and the semiconductor layers S, A, and D may include amorphous silicon.

The semiconductor layers S, A, and D may be doped with an N-type dopant or a P-type dopant. The semiconductor layers S, A, and D may include a heavily-doped region and a lightly-doped region. The conductivity of the heavily-doped region is greater than that of the lightly-doped region, and may serve as a source electrode and a drain electrode of the transistor TR. The lightly-doped region may correspond to an active (or channel) region of the transistors T.

The source region S, the channel region A, and the drain region D of the transistor TR may be formed from the semiconductor layers S, A, and D. The channel region A may be disposed between the source region S and the drain region D.

A first insulating layer INS1 may be disposed on the buffer layer BFL to cover the semiconductor layers S, A, and D. A gate electrode G of the transistor TR may be disposed on the first insulating layer INS1.

A second insulating layer INS2 may be disposed on the first insulating layer INS1 to cover the gate electrode G. A dummy electrode DME may be disposed on the second insulating layer INS2. The dummy electrode DME may be disposed over the gate electrode G and overlapped with the gate electrode G when viewed in a plan view. The dummy electrode DME may form a capacitor together with the gate electrode G.

A lower metal layer BML may be disposed on the second insulating layer INS2. The lower metal layer BML may be disposed in the same layer as the dummy electrode DME.

The lower metal layer BML and the dummy electrode DME may be simultaneously patterned with the same material. The lower metal layer BML may be disposed under the transistor TR' and overlapped with the transistor TR', when viewed in a plan view.

The lower metal layer BML may receive a constant voltage. When the constant voltage is applied to the lower metal layer BML, a threshold voltage value of the transistor TR' disposed over the lower metal layer BML may remain unchanged.

The lower metal layer BML may block light incident on the transistor TR' under the lower metal layer BML. The lower metal layer BML may include a reflective metal. When external light is incident to semiconductor layers S', A', and D' of the transistor TR', the semiconductor layers S', A', and D' of the transistor TR' may be damaged. The lower metal layer BML may block the external light to prevent damage to the semiconductor layers S', A', and D' of the transistor TR'.

The lower metal layer BML may be further disposed under the transistor TR. In this case, the lower metal layer BML may be interposed between the substrate SUB and the buffer layer BFL. The lower metal layer BML may be omitted.

A third insulating layer INS3 may be disposed on the second insulating layer INS2 to cover the lower metal layer BML and the dummy electrode DME. The semiconductor layers S', A', and D' of the transistor TR' may be disposed on the third insulating layer INS3. The semiconductor layers S', A', and D' may include an oxide semiconductor including a metal oxide. The oxide semiconductor may include a crystalline or amorphous oxide semiconductor.

The semiconductor layers S', A', and D' may include a plurality of regions divided by whether the metal oxide is reduced. A region where the metal oxide is reduce (referred to as a reduced region) has conductivity greater than that of a region where the metal oxide is not reduced (referred to as a non-reduced region). The reduced region may serve as a source electrode or a drain electrode of the transistor TR'. The non-reduced region may correspond to the active (or channel) region of the transistor TR'.

The source region S', the channel region A', and the drain region D' of the transistor TR' may be formed from the semiconductor layers S', A', and D'. The channel region A' may be interposed between the source region S' and the drain region D'.

A fourth insulating layer INS4 may be disposed on the third insulating layer INS3 to cover the semiconductor layers S', A', and D'. A gate electrode G' of the transistor TR' may be disposed on the fourth insulating layer INS4. A fifth insulating layer INS5 may be disposed on the fourth insulating layer INS4 to cover the gate electrode G'.

The buffer layer BFL and the first to fifth insulating layers INS1 to INS5 may include inorganic layers. For example, the buffer layer BFL, the first insulating layer INS1, and the fourth insulating layer INS4 may include a silicon oxide layer, and the second insulating layer INS2 may include a silicon nitride layer.

Each of the third and fifth insulating layers INS3 and INS5 may include a plurality of inorganic insulating layers including different materials and stacked one another. For example, the third insulating layer INS3 may include a silicon nitride layer and a silicon oxide layer sequentially stacked, and the fifth insulating layer INS5 may include a silicon oxide layer and a silicon nitride layer sequentially stacked.

A thickness of each of the third and fifth insulating layers INS3 and INS5 may be greater than a thickness of each of the buffer layer BFL and the first, second, and fourth insulating layers INS1, INS2, and INS4. The "thickness" may be measured in the third direction DR3.

A plurality of first connection electrodes CNE1 and CNE1' may be disposed on the fifth insulating layer INS5. The first connection electrodes CNE1 may be electrically connected to the source region S and the drain region D through first contact holes CH1 formed in the first to fifth insulating layers INS1 to INS5. The first connection electrodes CNE1' may be electrically connected to the source region S' and the drain region D' through first contact holes CH1' formed in the first to fifth insulating layers INS1 to INS5.

A sixth insulating layer INS6 may be disposed on the fifth insulating layer INS5 to cover the first connection electrodes CNE1 and CNE1'. A second connection electrode CNE2 may be disposed on the sixth insulating layer INS6. The second connection electrode CNE2 may be electrically connected to the first connection electrode CNE1 that is connected to the drain region D through a second contact hole CH2 formed in the sixth insulating layer INS6. The first connection electrodes CNE1' and the first connection electrode CNE1 connected to the source region S may be connected to different transistors of the pixel PX.

A seventh insulating layer INS7 may be disposed on the sixth insulating layer INS6 to cover the second connection electrode CNE2. The sixth and seventh insulating layers INS6 and INS7 may include an inorganic layer or an organic layer.

The fifth insulating layer INS5 may be an interlayer insulating layer. The sixth insulating layer INS6 may be a first via insulating layer. The seventh insulating layer INS7 may be a second via insulating layer.

The light emitting element OLED may be disposed on the seventh insulating layer INS7. The light emitting element OLED may include a first electrode AE, a second electrode CE, a hole control layer HCL, an electron control layer ECL, and a light emitting layer EML. The first electrode AE may be an anode, and the second electrode CE may be a cathode. The second electrode CE is disposed on the first electrode AE, and the hole control layer HCL, the electron control layer ECL, and the light emitting layer EML may be disposed between the first electrode AE and the second electrode CE.

The first electrode AE may be disposed on the seventh insulating layer INS7. The first electrode AE may be electrically connected to the second connection electrode CNE2 through a third contact hole CH3 formed in the seventh insulating layer INS7. Accordingly, the light emitting element OLED may be connected to the transistor TR through the second connection electrode CNE2 and the first connection electrode CNE1 connected to the second connection electrode CNE2.

When viewed in a plan view, the third contact hole CH3 may be overlapped with the non-light emitting region NLEA. The first electrode AE may be overlapped with the light emitting region LEA. In addition, the first electrode AE may be overlapped with a portion of the non-light emitting region NLEA adjacent to the light emitting region LEA.

A pixel defining layer PDL may be disposed on the first electrode AE and the seventh insulating layer INS7. A pixel opening PX_OP to expose a portion of the first electrode AE may be formed in the pixel defining layer PDL. When viewed in a plan view, the pixel opening PX_OP may be overlapped with the light emitting region LEA. When viewed in a plan view, the pixel defining layer PDL may be overlapped with the non-light emitting region NLEA.

The hole control layer HCL may be interposed on the first electrode AE and the pixel defining layer PDL. The hole control layer HCL may be disposed in common in the light emitting region LEA and the non-light emitting region NLEA. The hole control layer HCL may be a common layer that is commonly disposed in the pixels PX. The hole control layer HCL may include a hole transport layer and a hole injection layer.

The light emitting layer EML may be disposed on the hole control layer HCL. The light emitting layer EML may be disposed in the pixel opening PX_OP. Therefore, the light emitting layer EML may be overlapped with the light emitting region LEA. The light emitting layer EML may include an organic material and/or an inorganic material. The light emitting layer EML may generate any one of red, green, and blue light.

The electron control layer ECL may be disposed on the light emitting layer EML and the second electrode CE. The electron control layer ECL may be disposed in common in the light emitting region LEA and the non-light emitting region NLEA. The electron control layer ECL may include an electron transport layer and an electron injection layer. The electron control layer ECL may be a common layer commonly disposed in the pixels PX.

The second electrode CE may be disposed on the electron control layer ECL. The second electrode CE may be disposed in common in the pixels PX. For example, the second electrode CE may be disposed in common on the light emitting layer EML of the pixels PX and the pixel defining layer PDL. The second electrodes CE2 of the pixels PX may be an integral common electrode.

The light emitting element OLED may be a part disposed in the light emitting region LEA. In other words, portions of the hole control layer HCL, the electron control layer ECL, the first electrode AE, and the second electrode CE overlapped with the light emitting region LEA may be components of the light emitting element OLED.

A layer ranging from the buffer layer BFL to the seventh insulating layer INS7 may be the circuit element layer DP-CL. A layer in which the light emitting element OLED is disposed may be the display element layer DP-OLED.

The thin film encapsulation layer TFE may be disposed on the light emitting element OLED. The thin film encapsulation layer TFE may include an inorganic layer, an organic layer, and an inorganic layer sequentially stacked. The inorganic layer includes an inorganic material and may protect the pixels PX from moisture/oxygen. The organic layer includes an organic material and may protect the pixels PX from foreign substances such as dust particles.

A first voltage may be applied to the first electrode AE and a second voltage may be applied to the second electrode CE. Holes and electrons injected into the light emitting layer EML combine to form excitons, and the light emitting element OLED emits light as the excitons transition to the ground state. The light emitting element OLED may emit light to display an image.

Figure 6:
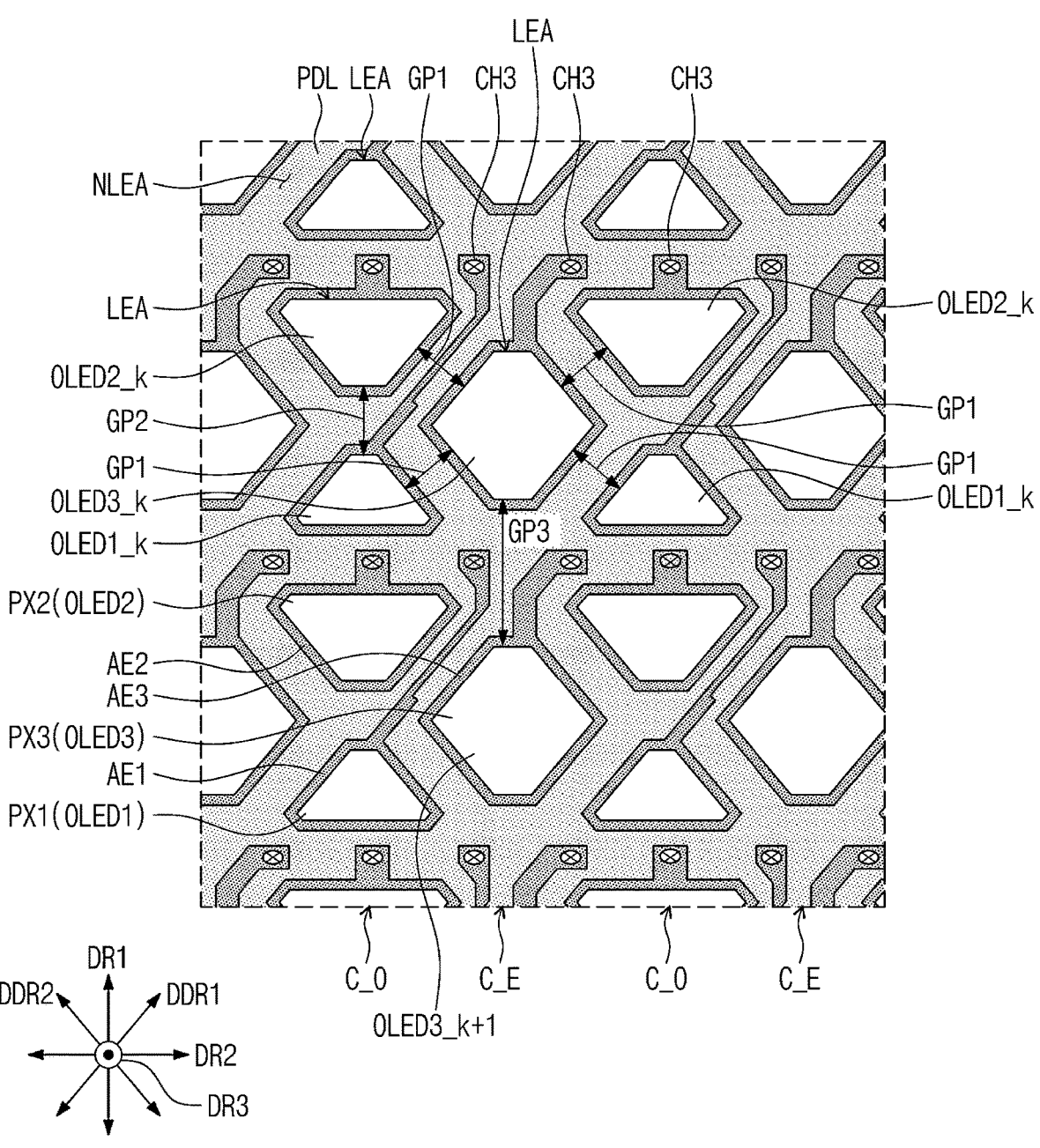
FIG. 6 is a view illustrating an arrangement state of light emitting elements of pixels disposed in a portion of a display region and first electrodes of the light emitting elements in FIG. 4 when viewed in a plan view
Figure 7:
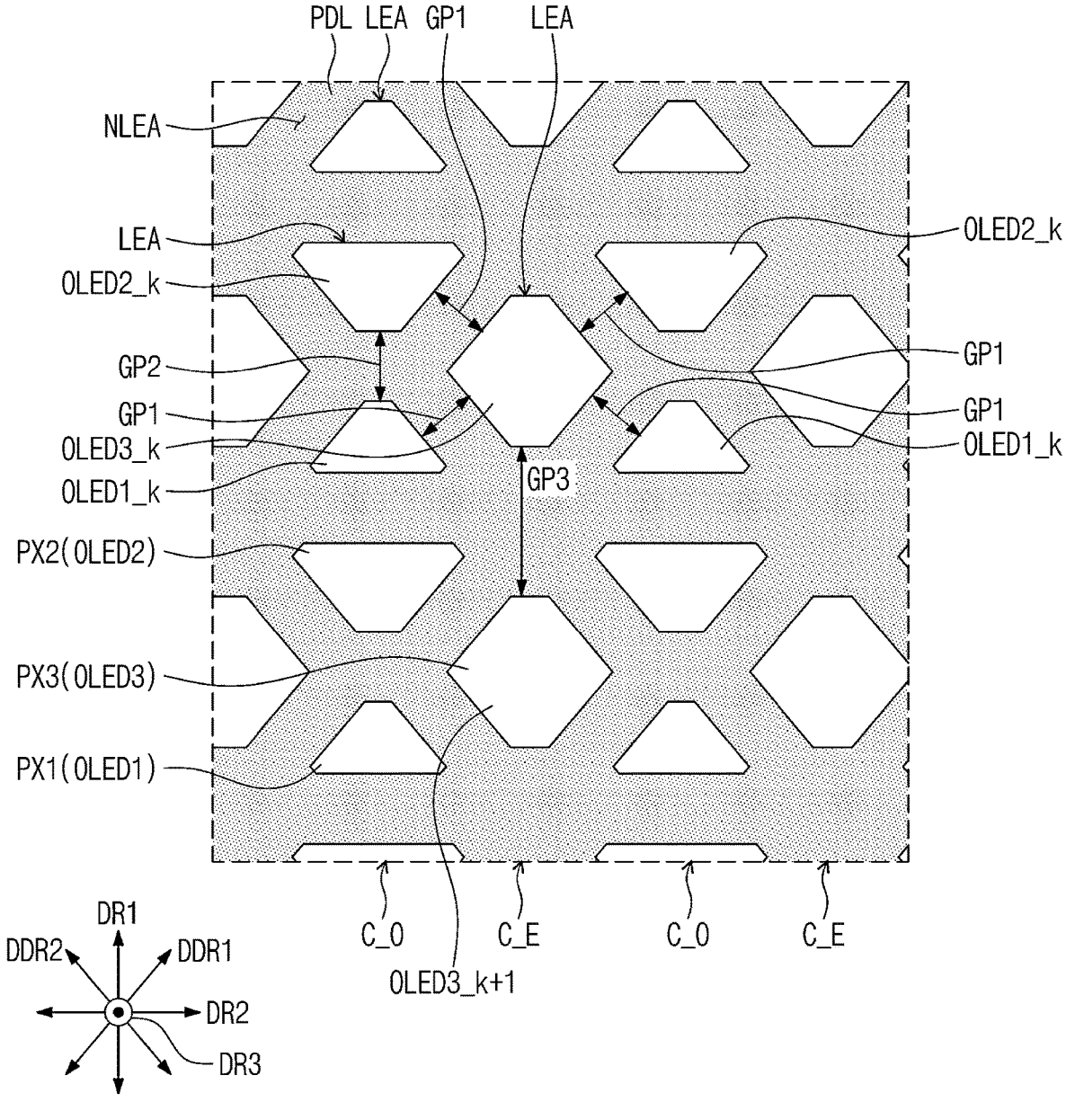
FIG. 7 is a view illustrating light emitting elements separately, without first electrodes of FIG. 6.

FIG. 6 is a view illustrating an arrangement state of light emitting elements of pixels disposed in a portion of a display region and first electrodes of the light emitting elements in FIG. 4 when viewed in a plan view. FIG. 7 is a view illustrating light emitting elements separately, without the first electrodes of FIG. 6.

Referring to FIGS. 6 and 7, the pixels PX of the display panel DP may include a plurality of first pixels PX1, a plurality of second pixels PX2, and a plurality of third pixels PX3. Hereinafter, in the present specification, a "column" may correspond to the first direction DR1 and a "row" may correspond to the second direction DR2.

The first pixels PX1 and the second pixels PX2 may be arranged in odd-numbered columns C_O, and the third pixels PX3 may be arranged in even-numbered columns C_E. The first pixels PX1 and the second pixels PX2 may be alternately arranged in the first direction DR1 in each of the odd-numbered columns C_O.

Each of the first pixels PX1 may include a first light emitting element OLED1. Each of the second pixels PX2 may include a second light emitting element OLED2. Each of the third pixels PX3 may include a third light emitting element OLED3.

Each of the first, second, and third light emitting elements OLED1, OLED2, and OLED3 may correspond to the light emitting element OLED illustrated in FIG. 5. Accordingly, each of the first, second, and third light emitting elements OLED1, OLED2, and OLED3 may include the first electrode AE, the second electrode CE, and the light emitting layer EML. The first light emitting elements OLED1 may display red, the second light emitting elements OLED2 may display green, and the third light emitting elements OLED3 may display blue.

For example, as illustrated in FIG. 6, the first electrodes AE of the first, second, and third light emitting elements OLED1, OLED2, and OLED3 are illustrated with different reference numerals. For example, FIG. 6 illustrates a planar configuration of a first electrode AE1 in the first light emitting element OLED1, a first electrode AE2 in the second light emitting element OLED2, and a first electrode AE3 in the third light emitting element OLED3. Each of the first electrodes AE1, AE2, and AE3 may be connected to the second connection electrode CNE2 described above through the corresponding third contact hole CH3.

Each of the first electrodes AE1, AE2, and AE3 may be disposed in the light emitting region LEA, and in a portion of the non-light emitting region NLEA adjacent to the light emitting region LEA. The first electrodes AE1, AE2, and AE3 may extend to protrude toward the third contact holes CH3 and overlap with the third contact holes CH3, respectively. For example, each of the first electrodes AE1, AE2, and AE3 may include an extension that protrudes toward its corresponding third contact hole CH3.

The first, second, and third light emitting elements OLED1, OLED2, and OLED3 may be disposed in the light emitting regions LEA, respectively. The pixel defining layer PDL may be disposed in the non-light emitting region NLEA around each of the light emitting regions LEA.

When viewed in a plan view, the first light emitting elements OLED1 may have a triangular shape. When viewed in a plan view, the second light emitting elements OLED2 may have an inverted triangular shape. The first light emitting element OLED1 and the second light emitting element OLED2 adjacent to each other may have shapes that are symmetrical to each other in the first direction DR1. When viewed in a plan view, the third light emitting elements OLED3 may have a rhombus shape. However, the present disclosure is not limited thereto, and the first, second, and third light emitting elements OLED1, OLED2, and OLED3 may have various shapes.

When viewed in a plan view, an area of each of the third light emitting elements OLED3 may be larger than an area of each of the second light emitting elements OLED2. When viewed in a plan view, an area of each of the second light emitting elements OLED2 may be larger than an area of each of the first light emitting elements OLED1.

The first light emitting elements OLED1 and the second light emitting elements OLED2 may be disposed in the odd-numbered columns C_O. The first light emitting elements OLED1 and the second light emitting elements OLED2 may be alternately arranged in the first direction DR1 in the odd-numbered columns C_O. In the odd-numbered columns C_O, the first light emitting elements OLED1 may be arranged in the same rows. In the odd-numbered columns C_O, the second light emitting elements OLED2 may be arranged in the same rows. For example, the first light emitting elements OLED1 may be arranged in a first row and the second light emitting elements OLED2 may be arranged in a second row.

The third light emitting elements OLED3 may be disposed in the even-numbered columns C_E. The third light emitting elements OLED3 may be arranged in the first direction DR1 in the even-numbered columns C_E. The odd-numbered column C_O and the even-numbered column C_E adjacent to each other may be referred to as an h-th column and an (h+1)-th column, respectively. In this case, 'h' is a natural number.

Hereinafter, a first diagonal direction DDR1 may be a direction crossing the first and second directions DR1 and DR2 on a plane defined by the first and second directions DR1 and DR2. A second diagonal direction DDR2 may be a direction crossing the first diagonal direction DDR1 on a plane defined by the first and second directions DR1 and DR2. The first diagonal direction DDR1 and the second diagonal direction DDR2 may intersect each other while forming a perpendicular angle.

Hereinafter, an arrangement of the first, second, and third light emitting elements OLED1, OLED2, and OLED3 in two odd-numbered columns C_O and the even-numbered column C_E adjacent to each other will be described. In the odd-numbered column C_O and the even-numbered column C_E adjacent to each other, the even-numbered column C_E may be disposed on a right side of the odd-numbered column C_O in the second direction DR2.

In the odd-numbered columns C_O, a k-th first light emitting element OLED1_$k$ and a k-th second light emitting element OLED2_$k$ may be disposed adjacent to each other in the first direction DR1. In the even-numbered columns C_E adjacent to each other, a k-th third light emitting element OLED3_$k$ may be disposed adjacent to the k-th first light emitting element OLED1_$k$ in the first diagonal direction DDR1, and be adjacent to the k-th second light emitting element OLED2_$k$ in the second diagonal direction DDR2. In this case 'k' is a natural number.

A distance between the k-th first light emitting element OLED1_$k$ and the k-th third light emitting element OLED3_$k$ in the first diagonal direction DDR1 and a distance between the k-th second light emitting element OLED2_$k$ and the k-th third light emitting element OLED3_$k$ in the second diagonal direction DDR2 may be a first distance GP1.

A distance between the k-th first light emitting element OLED1_$k$ and the k-th second light emitting element OLED2_$k$ in the first direction DR1 may have a second distance GP2 greater than the first distance GP1. A distance between the k-th third light emitting element OLED3_$k$ and a (k+1)-th third light emitting element OLED3_$k$+1 in the first direction DR1 may have a third distance GP3 greater than the second distance GP2.

The k-th first light emitting element OLED1_$k$, the k-th second light emitting element OLED2_$k$, and the k-th third light emitting element OLED3_$k$ adjacent to each other may form a pixel group.

The arrangement directions of the first and second light emitting elements OLED1 and OLED2 with respect to the third light emitting element OLED3_$k$ may vary depending on the arrangement reference. For example, the odd-numbered columns C_O may be disposed on a right side of the even-numbered columns C_E in the second direction DR2.

According to this arrangement, the k-th third light emitting element OLED3_$k$ may be disposed adjacent to the k-th second light emitting element OLED2_$k$ in the first diagonal direction DDR1, and may be disposed adjacent to the k-th first light emitting element OLED1_$k$ in the second diagonal direction DDR2. In this case, the distance between the k-th second light emitting element OLED2_$k$ and the k-th third light emitting element OLED3_$k$ in the first diagonal direction DDR1 and the distance between the k-th first light emitting element OLED1_$k$ and the k-th third light emitting element OLED3_$k$ in the second diagonal direction DDR2 may be the first distance GP1.

Figure 8:
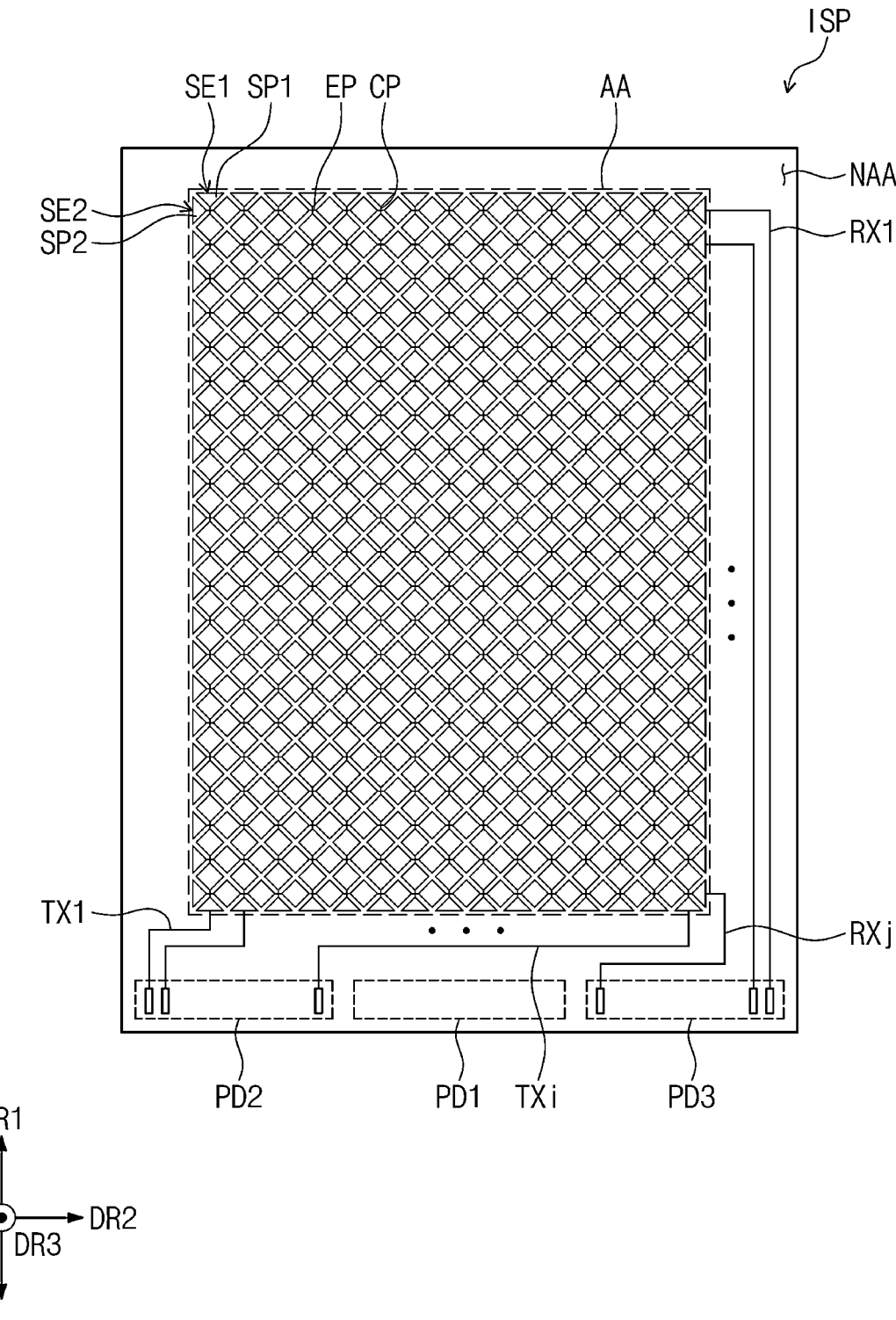
FIG. 8 is a plan view of an input sensing part illustrated in FIG. 2.

FIG. 8 is a plan view of the input sensing part illustrated in FIG. 2.

Referring to FIG. 8, the input sensing part ISP may include a plurality of sensing electrodes SE1 and SE2, a plurality of lines TX1 to TXi and RX1 to RXj, a plurality of second pads PD2, and a plurality of third pads PD3. The sensing electrodes SE1 and SE2, the lines TX1 to TXi and RX1 to RXj, and the second and third pads PD2 and PD3 may be disposed on the thin film encapsulation layer TFE of the display panel DP.

The planar region of the input sensing part ISP may include an active region AA and a non-active region NAA around the active region AA. The active region AA may be overlapped with the display region DA, and the non-active region NAA may be overlapped with the non-display region NDA.

The sensing electrodes SE1 and SE2 may be disposed in the active region AA, and the second pad PD2 and the third pad PD3 may be disposed in the non-active region NAA. When viewed in a plan view, the second pads PD2 and the third pads PD3 may be adjacent to a lower end of the input sensing part ISP. When viewed in a plan view, the first pads PD1 may be interposed between the second pads PD2 and the third pads PD3.

The lines TX1 to TXi and RX1 to RXj may be connected to first ends of the sensing electrodes SE1 and SE2, and extend to the non-active region NAA to be connected to the second and third pads PD2 and PD3. A sensing controller that controls the input sensing part ISP may be connected to the second and third pads PD2 and PD3 through the printed circuit board.

The sensing electrodes SE1 and SE2 may include the plurality of first sensing electrodes SE1 extending in the first direction DR1 and arranged in the second direction DR2 and the plurality of second sensing electrodes SE2 extending in the second direction DR2 and arranged in the first direction DR1. The second sensing electrodes SE2 may be insulated from the first sensing electrodes SE1 and extend to cross the first sensing electrodes SE1. The first sensing electrodes SE1 may be transmission electrodes, and the second sensing electrodes SE2 may be reception electrodes.

The lines TX1 to TXi and RX1 to RXj may include the plurality of first lines TX1 to TXi connected to the first sensing electrodes SE1 and the plurality of second lines RX1 to RXj connected to the second sensing electrodes SE2. In this case, 'i' and 'j' are natural numbers. The first lines TX1 to TXi may extend to the non-active region NAA and may be connected to the second pads PD2. The second lines RX1 to RXj may extend to the non-active region NAA and may be connected to the third pads PD3.

For example, when viewed in a plan view, the first lines TX1 to TXi may be disposed in the non-active region NAA adjacent to a lower side of the active region AA. When viewed in a plan view, the second lines RX1 to RXj may be disposed in the non-active region NAA adjacent to a right side of the active region AA. The first lines TX1 to TXi may be transmission wirings, and the second lines RX1 to RXj may be sensing lines (or reception wirings).

Each of the first sensing electrodes SE1 may include a plurality of first sensing parts SP1 arranged in the first direction DR1 and a plurality of connection patterns CP connection the first sensing parts SP1 to each other. Each of the connection patterns CP may be disposed between two first sensing parts SP1 adjacent to each other in the first direction DR1 to connect the two first sensing parts SP1 to each other.

The second sensing electrodes SE2 may include a plurality of second sensing parts SP2 and a plurality of extension patterns EP extending from the second sensing parts SP2 arranged in the second direction DR2. Each of the extension patterns EP may be disposed between two second sensing parts SP2 adjacent to each other in the second direction DR2 to extend from the two second sensing parts SP2.

Each of the first sensing parts SP1 and each of the second sensing parts SP2 may be spaced apart from each other without overlapping each other, and may be alternately arranged. Capacitances may be formed by the first sensing parts SP1 and the second sensing parts SP2. The extension patterns EP may be insulated from and extend to cross the connection patterns CP.

Figure 9:
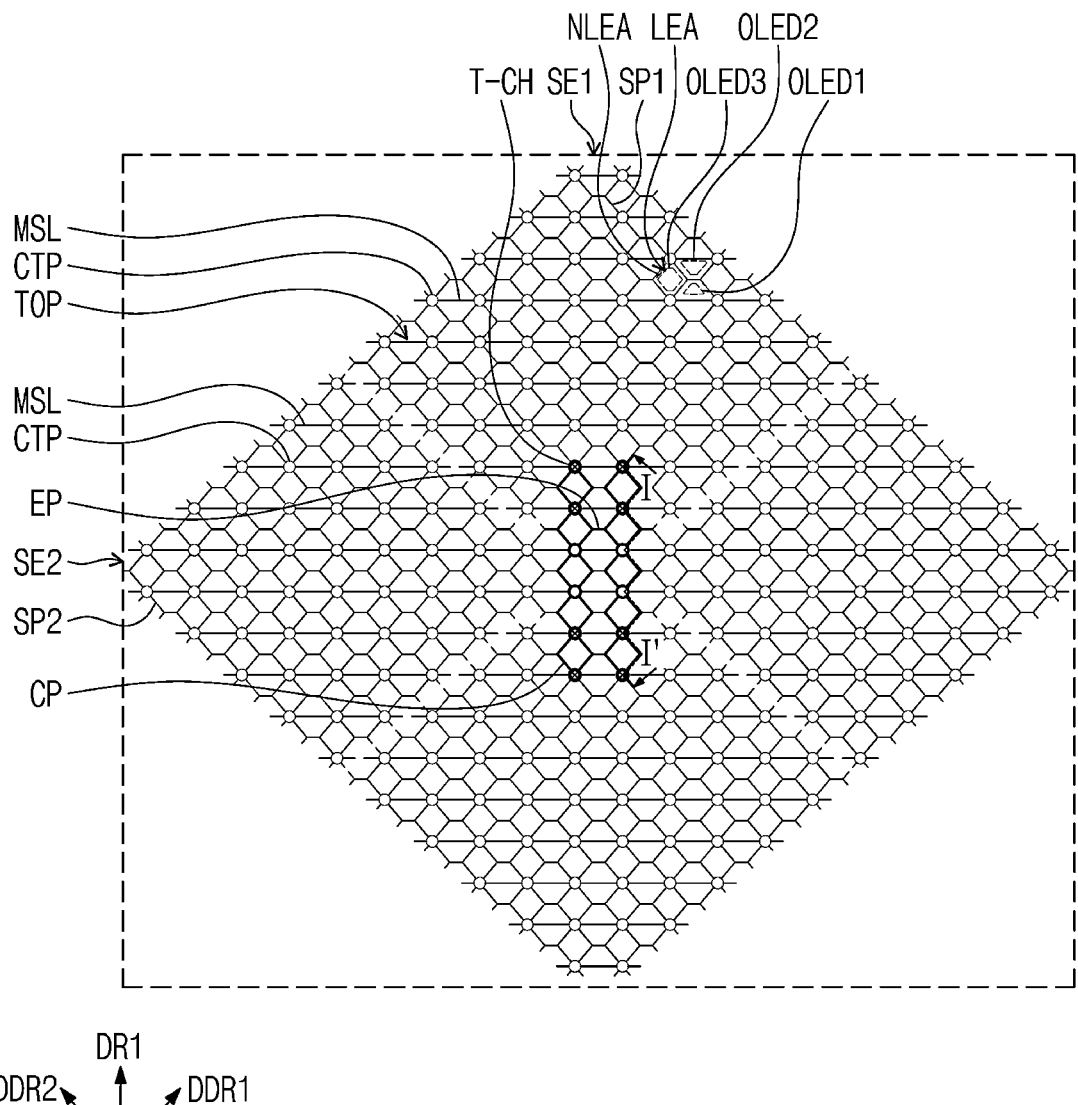
FIG. 9 is an enlarged view of two first sensing parts adjacent to each other and two second sensing parts adjacent to each other illustrated in FIG. 8.
Figure 10:
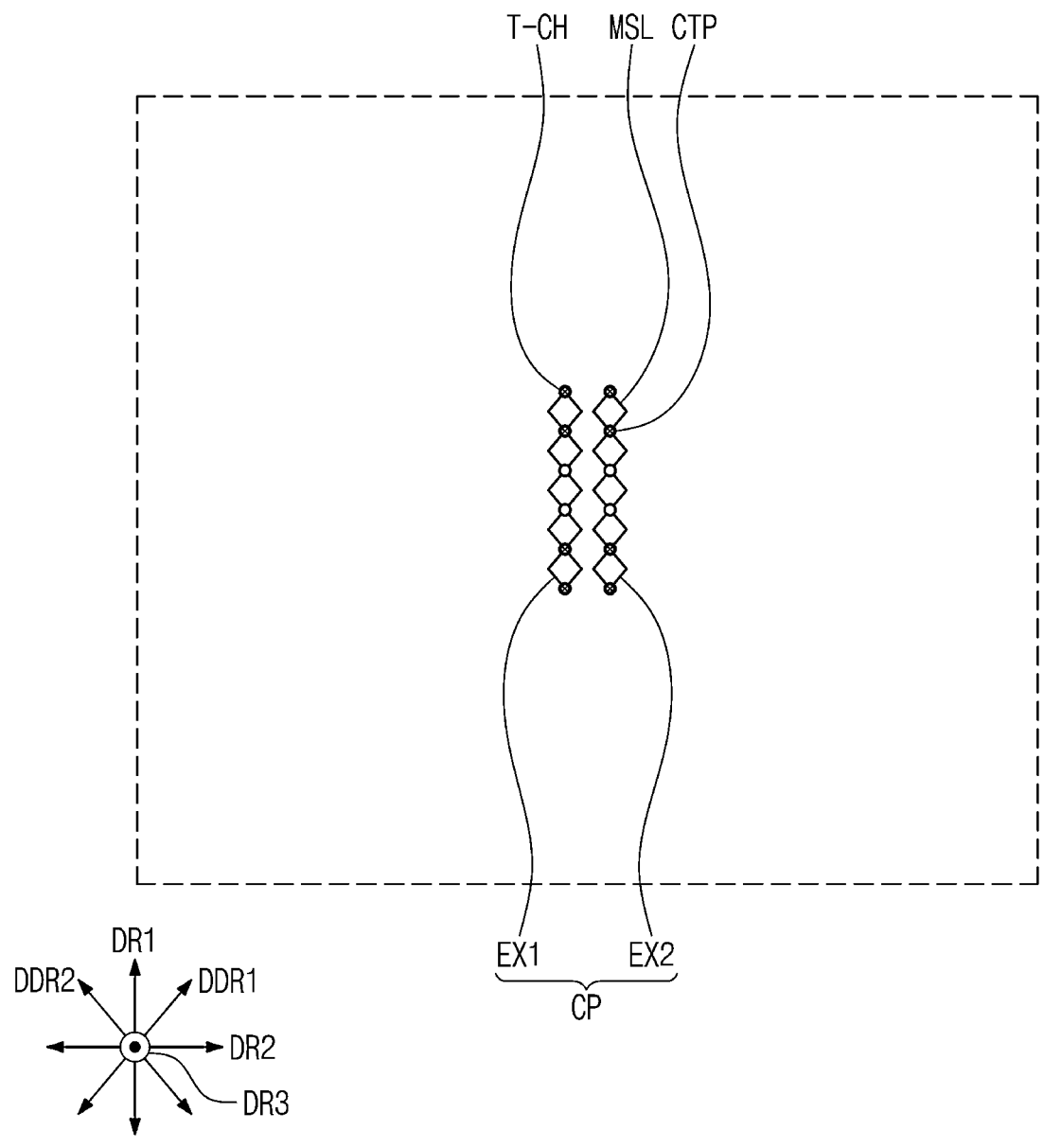
FIG. 10 is a view illustrating a connection pattern illustrated in FIG. 9.
Figure 11:
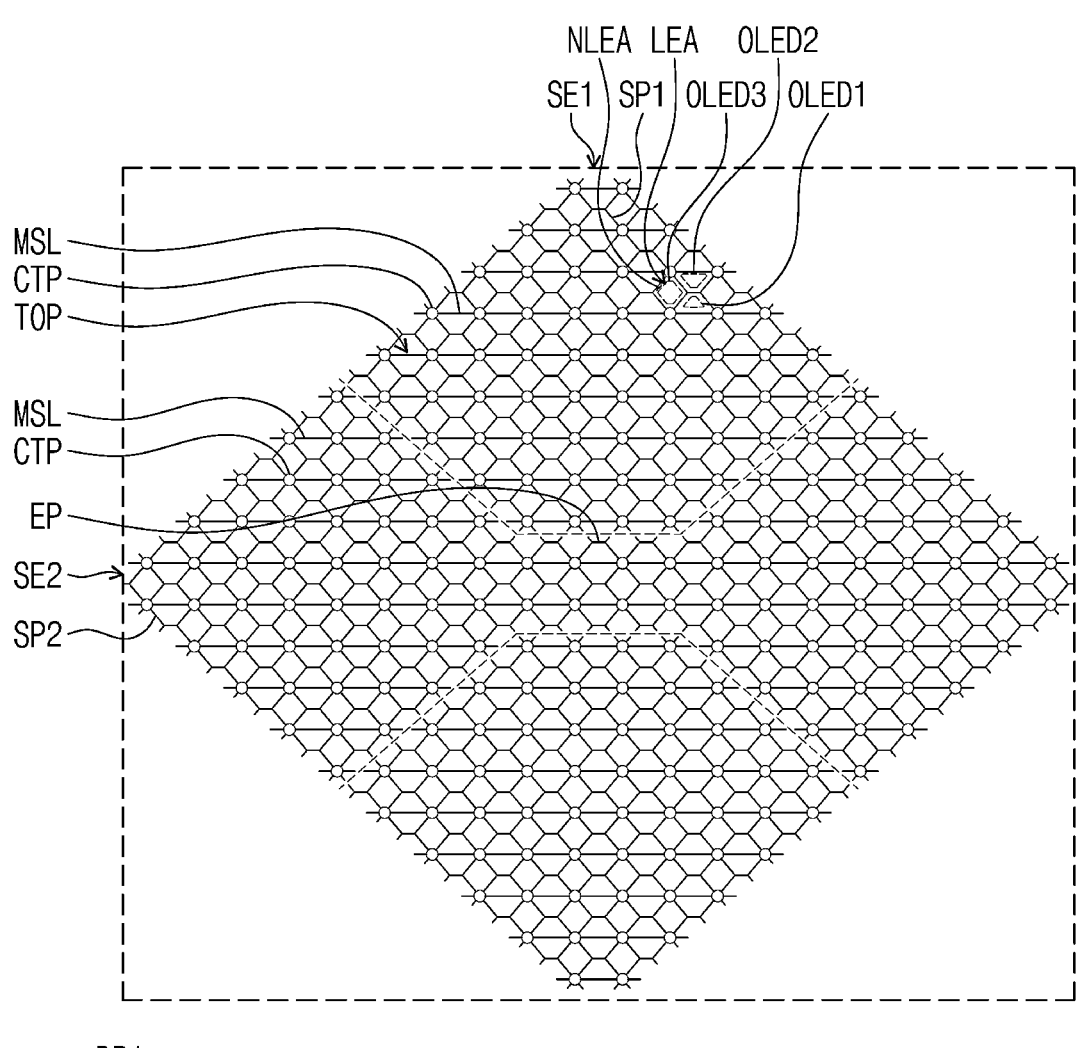
FIG. 11 is a view illustrating first and second sensing parts and an extension pattern illustrated in FIG. 9.
Figure 11:
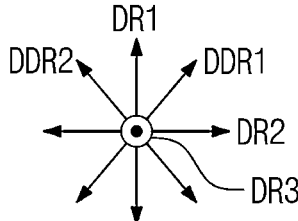

FIG. 9 is an enlarged view of two first sensing parts adjacent to each other and two second sensing parts adjacent to each other illustrated in FIG. 8. FIG. 10 is a view illustrating a connection pattern illustrated in FIG. 9. FIG. 11 is a view illustrating first and second sensing parts and an extension pattern illustrated in FIG. 9.

Referring to FIG. 9, each of the first sensing parts SP1 and the second sensing parts SP2 may include a plurality of mesh lines MSL and a plurality of conductive patterns CTP. In each of the first sensing part SP1 and the second sensing part SP2, the mesh lines MSL and the conductive patterns CTP may be integrally formed.

The mesh lines MSL may extend from the conductive patterns CTP in the first and second diagonal directions DDR1 and DDR2 and in the second direction DR2. Spaces surrounded by the mesh lines MSL and the conductive patterns CTP may be referred to as touch openings TOP.

When viewed in a plan view, the light emitting regions LEA may be disposed in the touch openings TOP. Each of the light emitting regions LEA may be the light emitting region LEA illustrated in FIGS. 5, 6, and 7. For the convenience of explanation, only three light emitting regions LEA adjacent to one another are illustrated by a dashed line in FIG. 9; however, each of the touch openings TOP includes a light emitting region LEA.

When viewed in a plan view, the mesh lines MSL and the conductive patterns CTP may be overlapped with the non-light emitting region NLEA without being overlapped with the light emitting regions LEA. Therefore, when viewed in a plan view, the first sensing parts SP1 and the second sensing parts SP2 may be overlapped with the non-light emitting region NLEA without overlapping the light emitting regions LEA.

Since the first and second sensing parts SP1 and SP2 are disposed in the non-light emitting region NLEA, light can be emitted normally from the light emitting regions LEA without being affected by the first and second sensing parts SP1 and SP2.

The extension pattern EP and the connection pattern CP may include mesh lines MSL and the conductive patterns CTP overlapped with the non-light emitting region NLEA without being overlapped with the light emitting regions LEA, like the first sensing parts SP1 and the second sensing parts SP2.

When viewed in a plan view, the mesh lines MSL and the conductive patterns CTP may be disposed between the first, second, and third light emitting elements OLED1, OLED2, and OLED3. A detailed arrangement structure of the mesh lines MSL and the conductive patterns CTP for the first, second, and third light emitting elements OLED1, OLED2, and OLED3 will be described in below in FIG. 13A.

Referring to FIGS. 9, 10, and 11, the extension pattern EP and the first and second sensing parts SP1 and SP2 may be disposed in a different layer from the connection pattern CP. For example, the connection pattern CP may be disposed on the thin film encapsulation layer TFE described above, and the extension pattern EP and the first and second sensing parts SP1 and SP2 may be disposed on the connection pattern CP. The extension pattern EP, the first sensing parts SP1, and the second sensing parts SP2 may be disposed in the same layer and may be formed by simultaneously patterning the same material.

The connection pattern CP may include a first extension part EX1 and a second extension part EX2 which extend in the first direction DR1 and are spaced apart from each other in the second direction DR2. The first extension part EX1 and the second extension part EX2 may have substantially the same shape. Both sides of the first and second extension parts EX1 and EX2, which are opposite to each other in the first direction DR1, may be overlapped with the first sensing parts SP1.

The first and second extension parts EX1 and EX2 may be connected to the first sensing parts SP1 through a plurality of contact holes T-CH that are overlapped with the first sensing parts SP1. The contact holes T-CH may be overlapped with some conductive patterns CTP of the first sensing parts SP1. A cross-sectional structure of the contact holes T-CH will be illustrated in FIG. 12.

The extension pattern EP may be disposed between the first sensing parts SP1, and may extend from the second sensing parts SP2 in the second direction DR2. The extension pattern EP may be integrally formed with the second sensing parts SP2. When viewed in a plan view, the extension pattern EP may extend to cross the connection pattern CP. An insulating layer is interposed between the extension pattern EP and the connection pattern CP, such that the extension pattern EP and the connection pattern CP may be insulated from each other.

The first sensing parts SP1 may be separated from the second sensing parts SP2 and the extension pattern EP. For example, a separated portion between the first sensing parts SP1 and the second sensing parts SP2 and a separated portion between the first sensing parts SP1 and the extension pattern EP are illustrated with dashed lines in FIG. 11.

Figure 12:
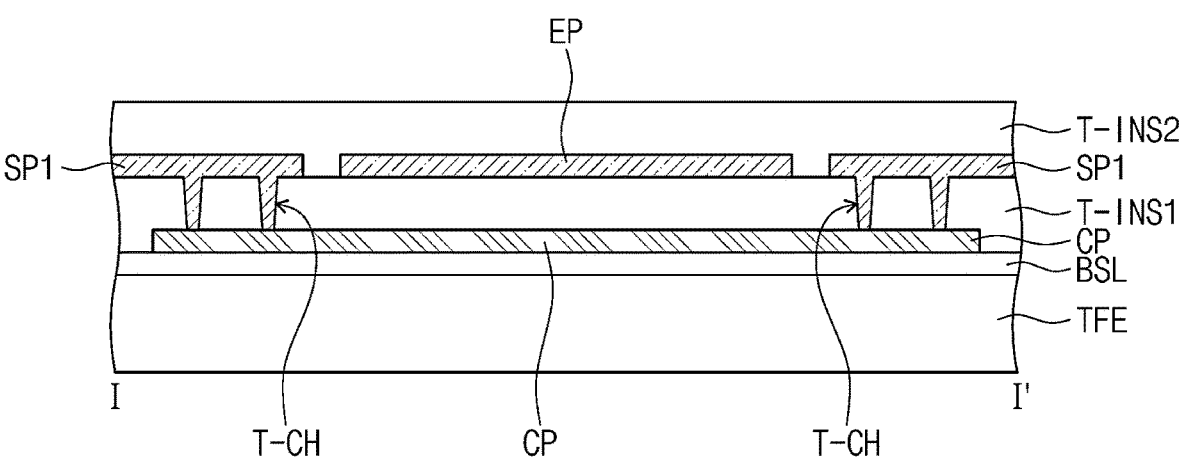
FIG. 12 is a cross-sectional view taken along line I-I' of FIG. 9.

FIG. 12 is a cross-sectional view taken along line I-I' illustrated in FIG. 9.

Referring to FIG. 12, a base layer BSL may be disposed on the thin film encapsulation layer TFE. The connection pattern CP may be disposed on the base layer BSL. A first insulating layer T-INS1 may be disposed on the connection pattern CP and the base layer BSL. The first insulating layer T-INS1 may be disposed on the base layer BSL to cover the connection pattern CP. The first insulating layer T-INS1 may include an inorganic insulating layer or an organic insulating layer.

The first sensing parts SP1 and the extension pattern EP may be disposed on the first insulating layer T-INS1. The second sensing parts SP2 integrally formed with the extension pattern EP may also be disposed on the first insulating layer T-INS1. The connection pattern CP may be connected to the first sensing parts SP1 through the plurality of contact holes T-CH defined in the first insulating layer T-INS1.

A second insulating layer T-INS2 may be disposed on the first sensing parts SP1, the extension pattern EP, and the first insulating layer T-INS1. The second insulating layer T-INS2 may include an organic insulating layer.

Figure 13A:
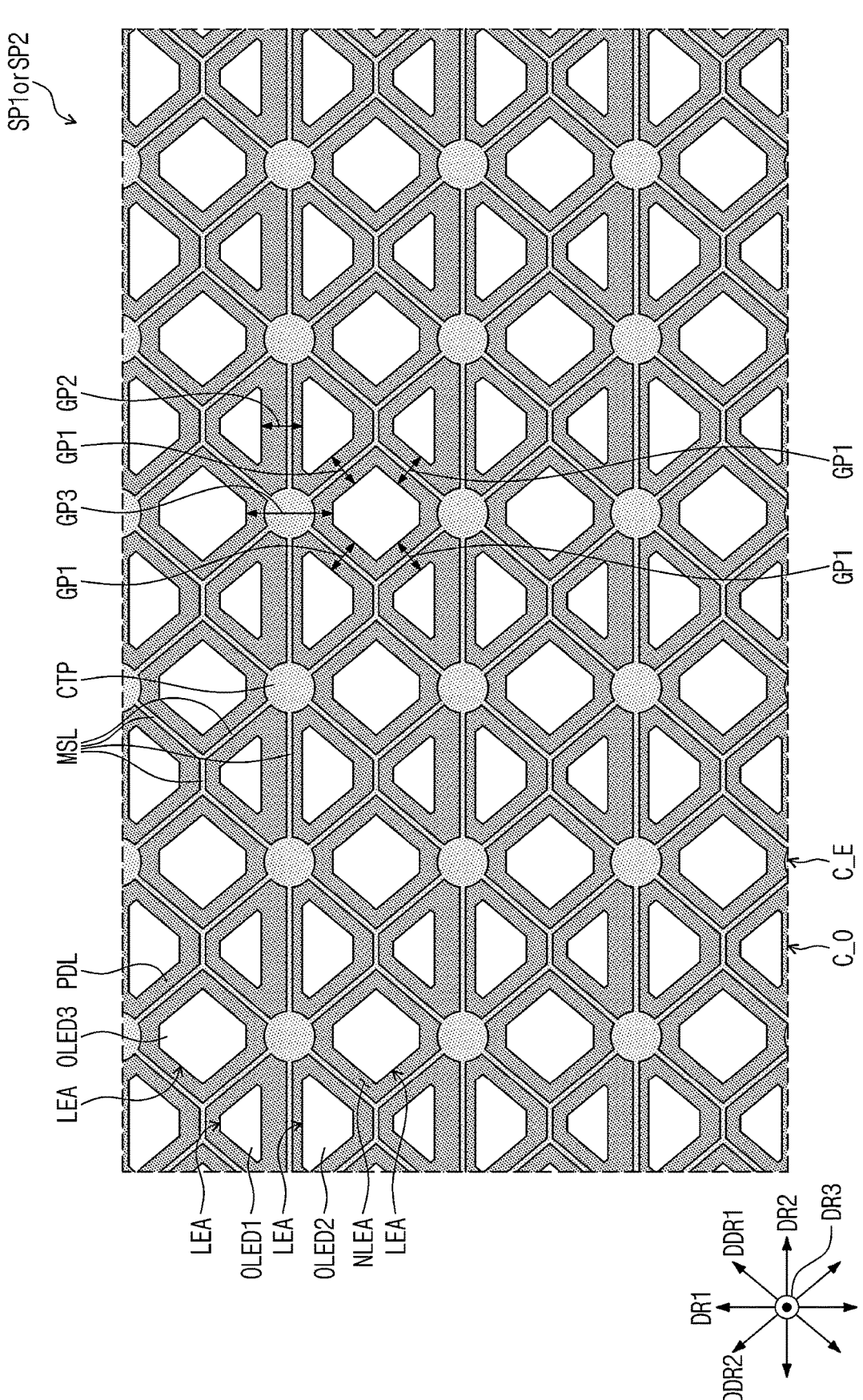
FIG. 13A is an enlarged view of a partial region of any one of the first and second sensing parts illustrated in FIG. 9
Figure 13B:
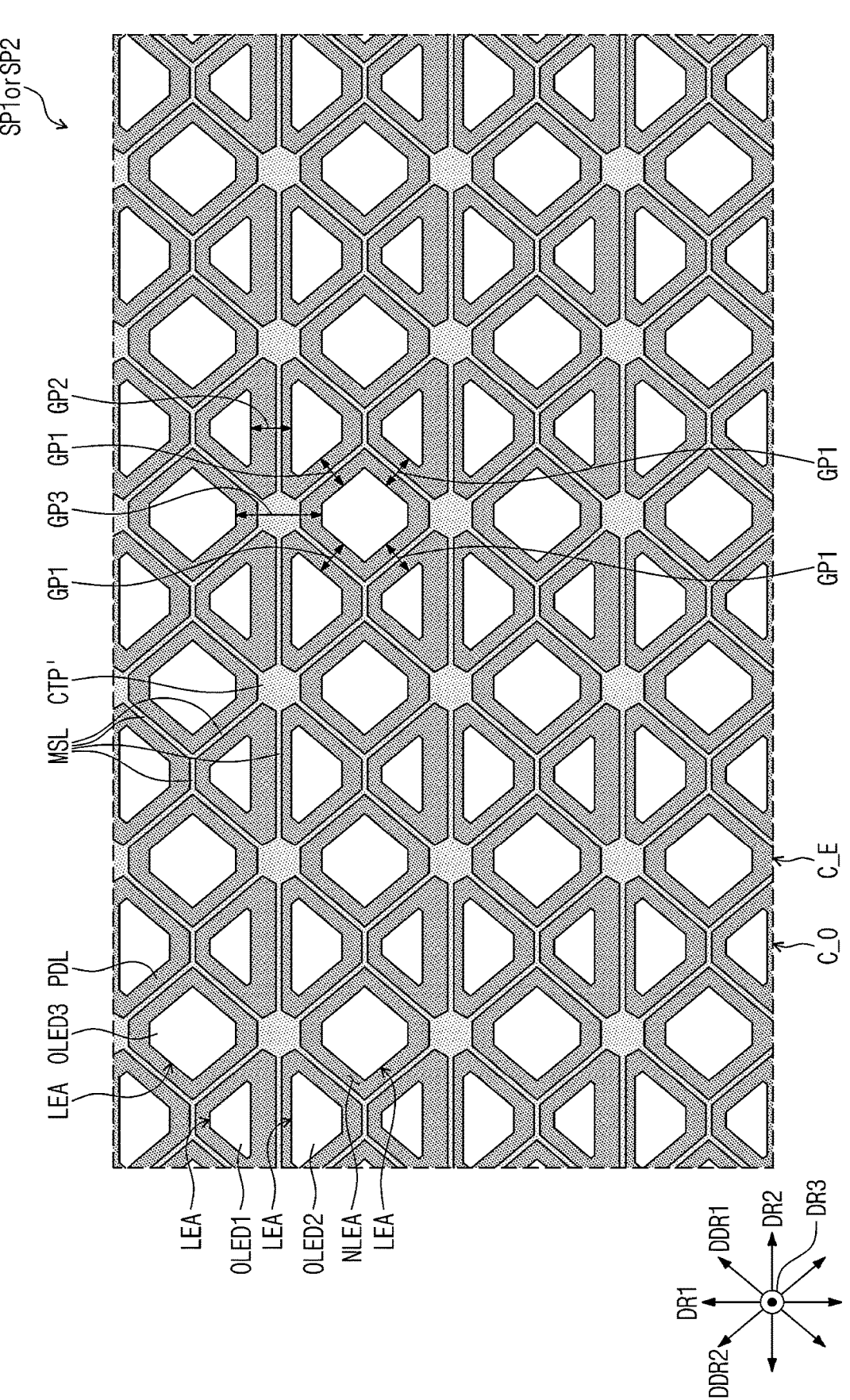
FIG. 13B is an enlarged view corresponding to FIG. 13A, which is a view illustrating another shape of conductive patterns.

FIG. 13A is an enlarged view of a partial region of any one of the first and second sensing parts illustrated in FIG. 9. FIG. 13B is an enlarged view corresponding to FIG. 13A, which is a view illustrating another shape of conductive patterns.

Referring to FIG. 13A, when viewed in a plan view, the mesh lines MSL may be interposed between the first and second light emitting elements OLED1 and OLED2, between the first and third light emitting elements OLED1 and OLED3, and between the second and third light emitting elements OLED2 and OLED3.

When viewed in a plan view, the conductive patterns CTP may be interposed between the third light emitting elements OLED3 disposed in at least one column. As described above, since the third light emitting elements OLED3 are disposed in the even-numbered columns, the conductive patterns CTP may be interposed between the third light emitting elements OLED3 disposed in at least one even-numbered column. The mesh lines MSL may extend from the conductive patterns CTP and may be integrally formed with the conductive patterns CTP.

The conductive patterns CTP may be arranged in the first direction DR1 and the second direction DR2. In other words, the conductive patterns CTP may be arranged in a plurality of rows corresponding to the second direction DR2 and a plurality of columns corresponding to the first direction DR1. For example, an individual row of the plurality of rows may extend in the second direction DR2 and an individual column of the plurality of columns may extend in the first direction DR1. With respect to the third light emitting elements OLED3, the third light emitting elements OLED3 may also be arranged in a plurality of rows corresponding to the second direction DR2 and a plurality of columns corresponding to the first direction DR1.

For example, the conductive patterns CTP are interposed between the third light emitting elements OLED3 disposed in all even-numbered columns, but embodiments of the present disclosure are not limited thereto. For example, the conductive patterns CTP may be interposed only between the third light emitting elements OLED3 disposed in some even-numbered columns.

A width of each of the conductive patterns CTP may be greater than a width of each of the mesh lines MSL. A width of each of the mesh lines MSL may be a value measured in a direction perpendicular to an extending direction of each of the mesh lines MSL.

As illustrated in FIG. 13A, the conductive patterns CTP may have a circular shape when viewed in a plan view, but the shapes of the conductive patterns CTP are not limited thereto. For example, as illustrated in FIG. 13B, conductive patterns CTP' may have a polygonal shape. As illustrated in FIG. 13A, when the conductive patterns CTP have the circular shape, a width of each of the conductive patterns CTP may be a diameter of each of the conductive patterns CTP.

As illustrated in FIG. 13B, when the conductive patterns CTP' have the polygonal shape, a width of each of the conductive patterns CTP' may be a numerical value measured in a direction perpendicular to a side of the polygon. For example, the conductive patterns CTP' illustrated in FIG. 13B may have a hexagonal shape. In this case, a width of each of the conductive patterns CTP' may be a numerical value measured in the first direction DR1, the first diagonal direction DDR1, and the second diagonal direction DDR2 along sides of the conductive patterns CTP'.

As described above, a distance between the adjacent third light emitting elements OLED3 may be the third distance GP3 and be greater than the first distance GP1 and the second distance GP2. Accordingly, the conductive patterns CTP may be disposed as conductors having a larger width between the third light emitting elements OLED3. In other words, according to an embodiment of the present disclosure, the mesh lines MSL may not be disposed between the third light emitting elements OLED3, and the conductive patterns CTP having the larger width may be disposed between the third light emitting elements OLED3.

Since the mesh lines MSL are not disposed between the third light emitting elements OLED3, and the conductive patterns CTP having a larger width are used instead, the area of the conductor of each of the first and second sensing parts SP1 and SP2 can be increased. The capacitance is proportional to the area of the conductor, so increasing the capacitance can improve touch sensitivity.

According to an embodiment of the present disclosure, since each of the first and second sensing parts SP1 and SP2 includes the conductive patterns CTP, capacitances formed by the first and second sensing parts SP1 and SP2 may be increased. Accordingly, the touch sensitivity of the input sensing part ISP may be improved.

FIGS. 14 to 19 are views illustrating cut patterns of first and second sensing parts according to various embodiments of the present disclosure.

Figure 14:
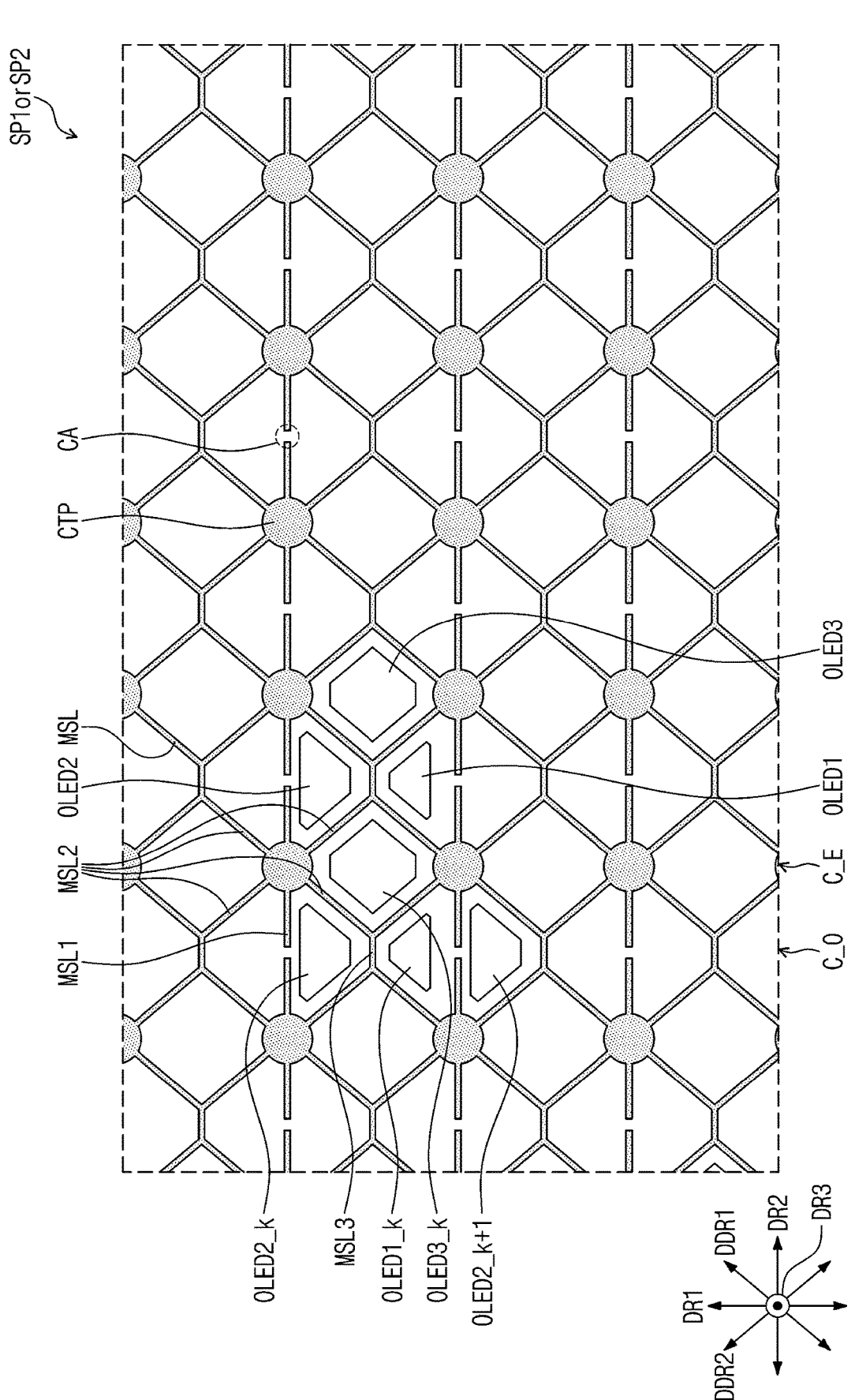
FIGS. 14, 15, 16, 17, 18 and 19 are views illustrating cutout patterns of first and second sensing parts according to various embodiments of the present disclosure.
Figure 15:
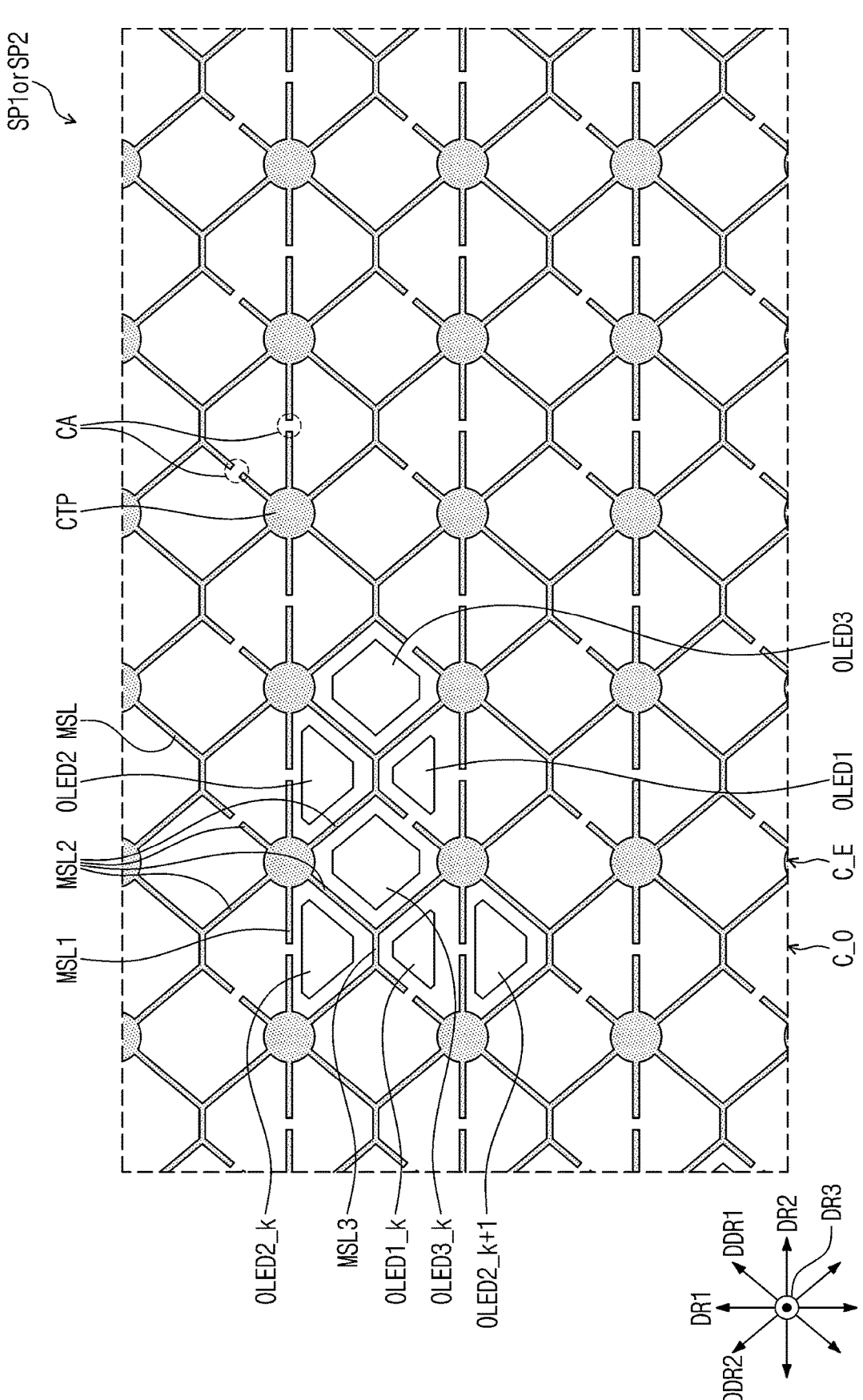

FIGS. 14 to 19 are plan views corresponding to FIG. 13A. For convenience of explanation, unlike FIG. 13A, some of the first, second, and third light emitting elements OLED1, OLED2, and OLED3 are illustrated in FIGS. 14 and 15, and the remaining portions of the first, second, and third light emitting elements OLED1, OLED2, and OLED3 are omitted. In addition, in FIG. 16, the third light emitting elements OLED3 are illustrated, the first and second light emitting elements OLED1 and OLED2 are omitted. In addition, in FIGS. 17 to 19, the first, second, and third light emitting elements OLED1, OLED2, and OLED3 are omitted.

Referring to FIGS. 14 to 19, some mesh lines MSL of the mesh lines MSL may be cut from each of the first and second sensing parts SP1 and SP2. Portions of some mesh lines MSL may be cut out to form cutout regions CA, CA1, and CA2 in each of the first and second sensing parts SP1 and SP2. The "cutting" state may be a state where a specific portion of each of the some mesh lines MSL is removed.

Hereinafter, a detailed structure and various cutting patterns of the mesh lines MSL will be described.

Referring to FIGS. 14 and 15, the mesh lines MSL may include a plurality of first mesh lines MSL1, a plurality of second mesh lines MSL2, and a plurality of third mesh lines MSL3. The first and third mesh lines MSL1 and MSL3 may extend in the second direction DR2. The second mesh lines MSL2 may extend in the first diagonal direction DDR1 and the second diagonal direction DDR2.

The first mesh lines MSL1 may extend in the second direction DR2 from the corresponding conductive pattern CTP. The second mesh lines MSL2 may extend in the first diagonal direction DDR1 and the second diagonal direction DDR2 from the corresponding conductive patterns CTP. The third mesh line MSL3 may extend in the second direction DR2 from a contact point between the second mesh line MSL2 extending in the first diagonal direction DDR1 and the second mesh line MSL2 extending in the second diagonal direction DDR2.

When viewed in a plan view, in each of the odd-numbered columns C_O, each of the first mesh lines MSL1 may be interposed between the k-th first light emitting element OLED1_$k$ and a (k+1)-th second light emitting element OLED2_$k$+1.

When viewed in a plan view, the second mesh lines MSL2 may be disposed between the first light emitting elements OLED1 and the third light emitting elements OLED3 and between the second light emitting elements OLED2 and the third light emitting elements OLED3.

When viewed in a plan view, in each of the odd-numbered columns C_O, each of the third mesh lines MSL3 may be interposed between the k-th first light emitting element OLED1_$k$ and the k-th second light emitting element OLED2_$k$.

The mesh lines MSL are identically defined in FIGS. 16 to 19, and for the convenience of explanation, the k-th first, second, and third light emitting elements OLED1_$k$, OLED2_$k$, and OLED_k, and (k+1)th third light emitting elements OLED3_$k$+1 are omitted in FIGS. 16 to 19.

Hereinafter, a detailed cutout pattern for each of FIGS. 14 to 19 will be described.

Referring to FIG. 14, the first mesh lines MSL1 may be cut. For example, the first mesh lines MSL1 may be cut to form an open space that overlaps with the k-th second light emitting element OLED2_$k$. The number of the first mesh lines MSL1 which are cut out may be variously set. For example, at least one first mesh line MSL1 among the first mesh lines MSL1 may be cut. Portions of the first mesh lines MSL1 may be cut out to form cutout regions CA. For example, the cutout regions may overlap with the second light emitting elements OLED2.

Referring to FIG. 15, the first mesh lines MSL1 may be cut out to form the cutout regions CA. In addition, one second mesh line MSL2 of the second mesh lines MSL2 extending from each of the conductive patterns CTP may be cut out to form a cutout region CA.

Figure 16:
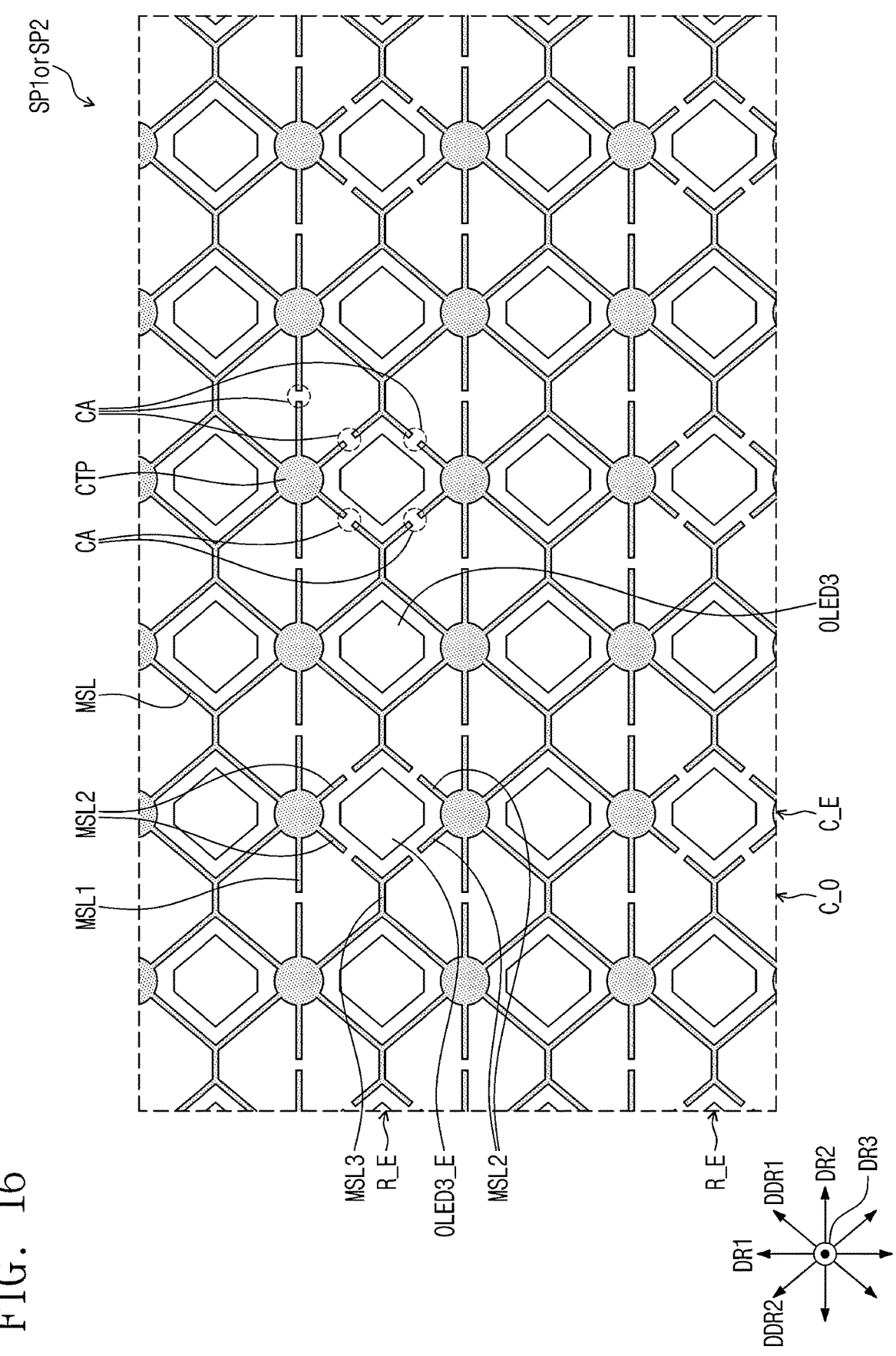

Referring to FIG. 16, the first mesh lines MSL1 may be cut out to form the cutout regions CA.

As described above, the third light emitting elements OLED3 may be arranged in a plurality of rows and a plurality of columns. The second mesh lines MSL2 adjacent to each of even-numbered third light emitting elements OLED3_E among the third light emitting elements OLED3 arranged in even-numbered rows R_E may be cut out to form the cutout regions CA. The even-numbered third light emitting elements OLED3_E may be arranged in order in the second direction DR2 in each of the even-numbered rows R_E.

Figure 17:
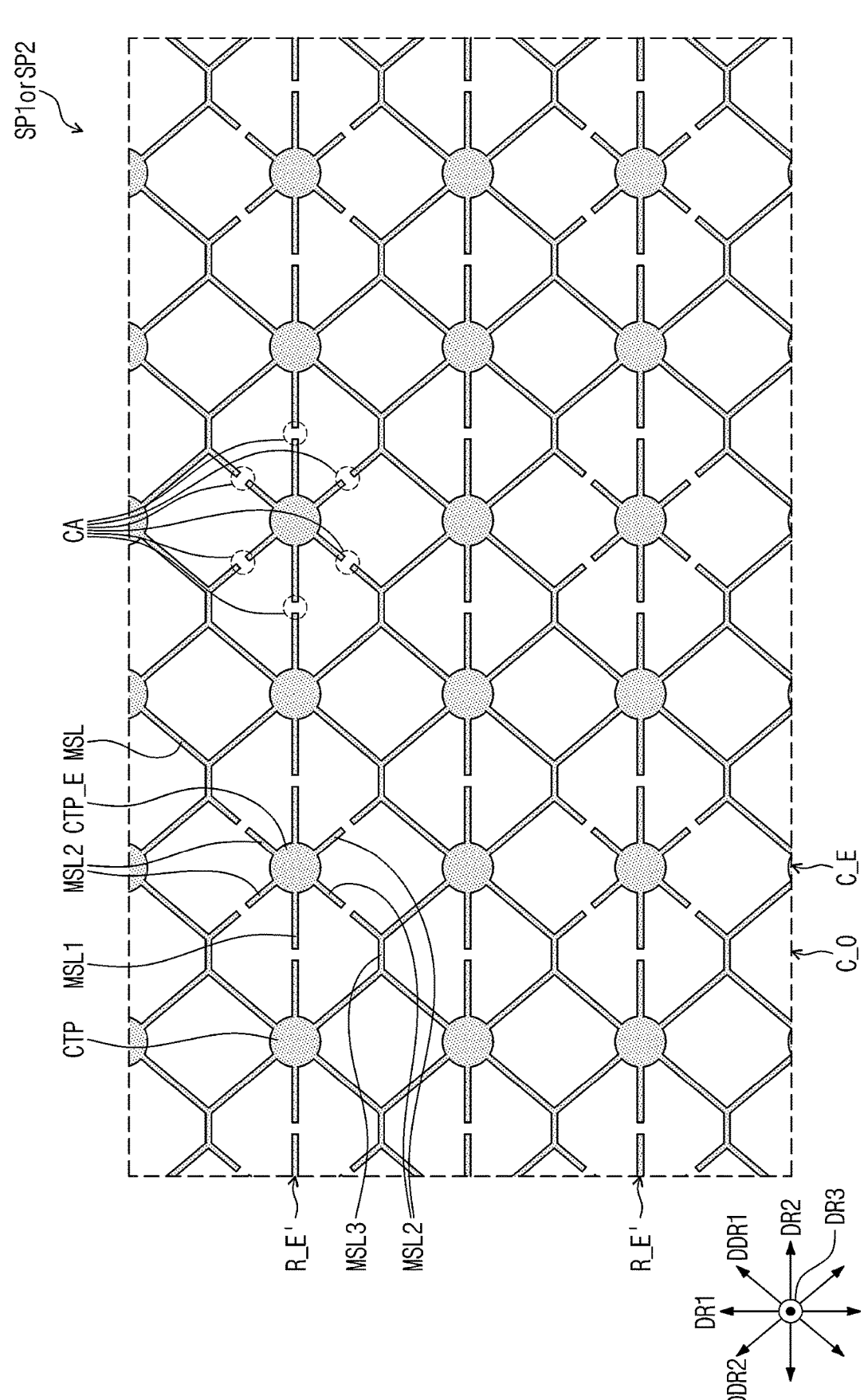

Referring to FIG. 17, the cutout regions CA may be formed by cutting out the first mesh lines MSL1.

As described above, the conductive patterns CTP may be arranged in the plurality of rows and the plurality of columns. The second mesh lines MSL2 extending from each of even-numbered conductive patterns CTP_E among the conductive patterns CTP arranged in the even-numbered rows R_E' may be cut out to form the cutout regions CA. The even-numbered conductive patterns CTP_E may be arranged in order in the second direction DR2 in each of the even-numbered rows R_E'. The cutout regions CA in FIG. 17 may be disposed between adjacent even-numbered conductive patterns CTP_E in the even-numbered rows R_E'.

Figure 18:
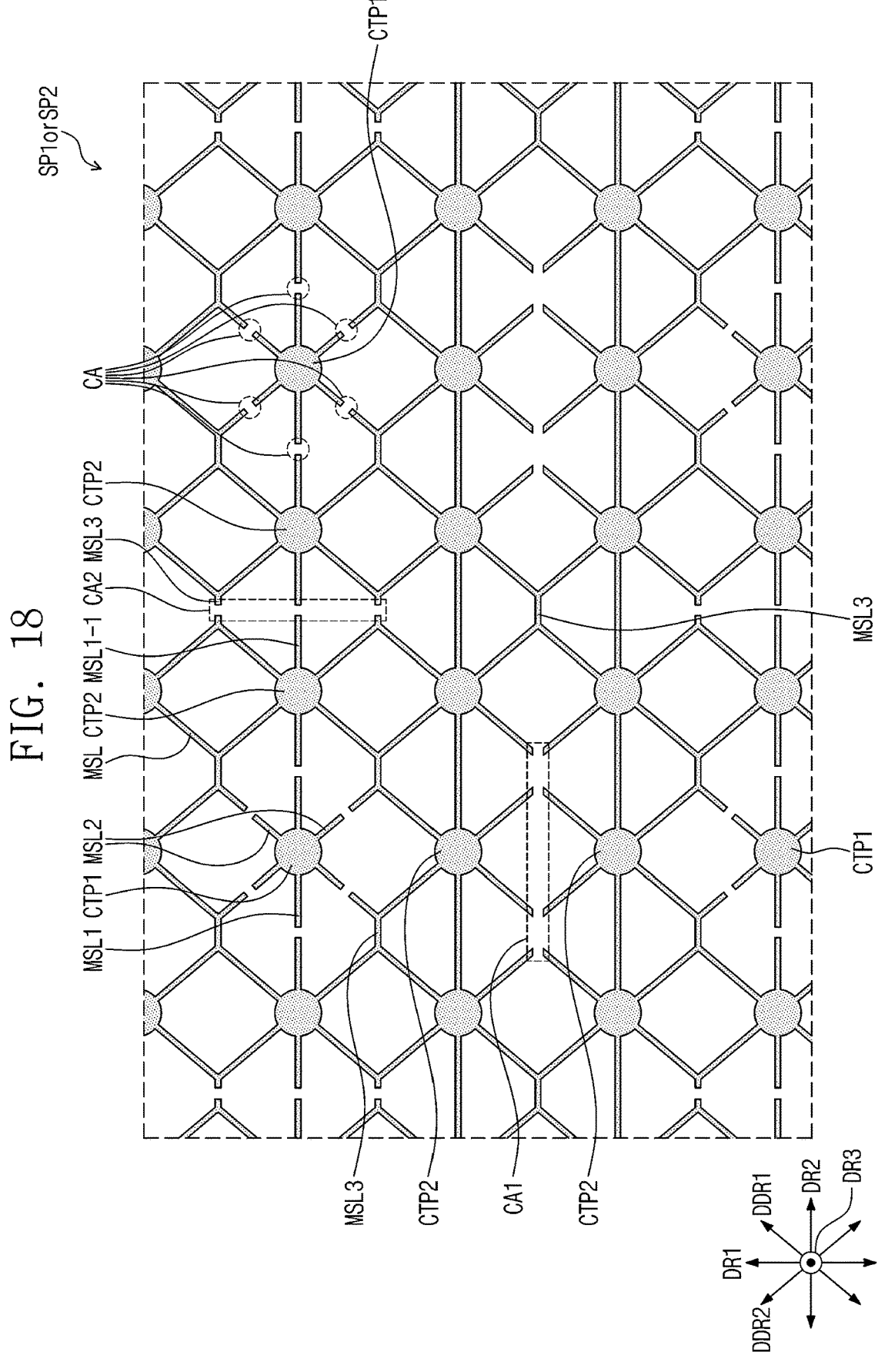

Referring to FIG. 18, the conductive patterns CTP may include a plurality of first conductive patterns CTP1 and a plurality of second conductive patterns CTP2. The first conductive patterns CTP1 may be arranged in the first and second directions DR1 and DR2.

At least two second conductive patterns CTP2 may be interposed between two first conductive patterns CTP1 adjacent to each other in the first direction DR1. At least two second conductive patterns CTP2 may be interposed between two first conductive patterns CTP1 adjacent to each other in the second direction DR2. The first and second mesh lines MSL1 and MSL2 extending from each of the first conductive patterns CTP1 may be cut out to form the cutout regions CA.

Two adjacent third mesh lines MSL3, which are between the second conductive patterns CTP2 that are interposed between the first conductive patterns CTP1 and adjacent to each other in the first direction DR1, may be removed. For example, the entire portions of the two adjacent third mesh lines MSL3 may be cut out, thereby forming the cutout regions CA1.

The first mesh line MSL1 between the second conductive patterns CTP2 interposed between the first conductive patterns CTP1 adjacent to each other in the second direction DR2 may be referred to as a (1-1)-th mesh line MSL1-1. The (1-1)-th mesh line MSL1-1 and the two third mesh lines MSL3 adjacent to the (1-1)-th mesh line MSL1-1 in the first direction DR1 may be cut out. The (1-1)-th mesh line MSL1-1 and the third mesh line MSL3 may be cut out to form the cutout regions CA2.

Figure 19:
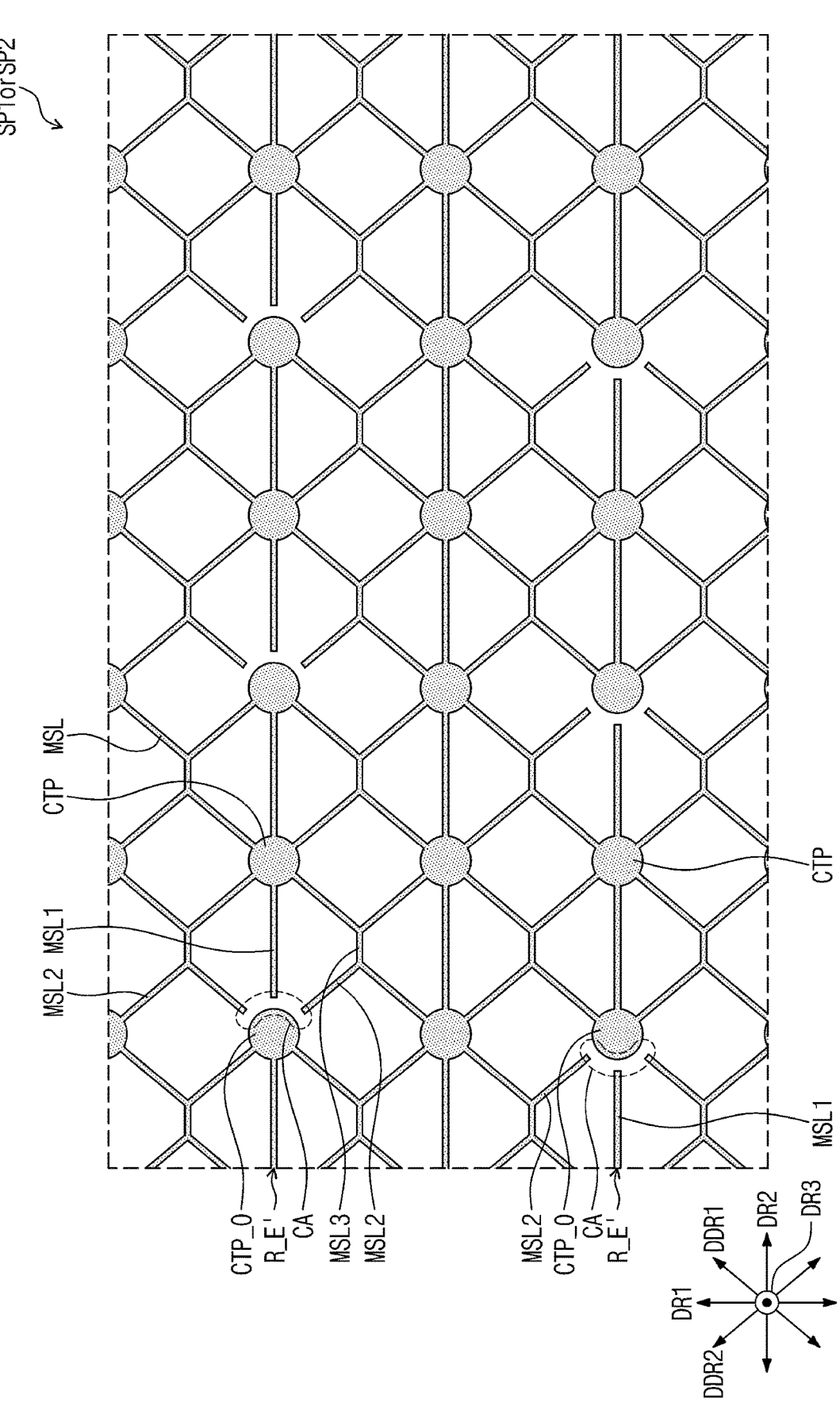

Referring to FIG. 19, among the conductive patterns CTP arranged in the even-numbered rows R_E', portions of the first and second mesh lines MSL1 and MSL2 adjacent to a first side of the odd-numbered conductive patterns CTP_O, or portions of the first and second mesh lines MSL1 and MSL2 adjacent to a second side of the odd-numbered conductive patterns CTP_O, may be removed.

A first side of the conductive patterns CTP and a second side of the conductive patterns CTP may be referred to as sides opposite to each other in the second direction DR2. The odd-numbered conductive patterns CTP_O may be arranged in order in the second direction DR2 in each of the even-numbered rows R_E'. Portions of the first and second mesh lines MSL1 and MSL2 may be removed to form the cutout regions CA.

According to the order of the even-numbered rows R_E', the portions of the first and second mesh lines MSL1 and MSL2 adjacent to the first side of the odd-numbered conductive patterns CTP_O and the portions of the first and second mesh lines MSL1 and MSL2 adjacent to the second side of the odd-numbered conductive patterns CTP_O may be alternately removed.

For example, in a p-th row of the even-numbered rows R_E', the portions of the first and second mesh lines MSL1 and MSL2 adjacent to the first side of the odd-numbered conductive patterns CTP_O may be removed. In a (p+1)-th row of the even-numbered rows R_E', portions of the first and second mesh lines MSL1 and MSL2 adjacent to the second side of the odd-numbered conductive patterns CTP_O may be removed.

Referring to FIGS. 14 to 19, the mesh shapes of the first and second sensing parts SP1 and SP2 may be visually recognized by the user depending on reflection of external light. When portions of the mesh lines MSL are removed to form the cutout regions CA, CA1, and CA2, external light may not be reflected from the cutout regions CA, CA1, and CA2. Consequently, the mesh shapes of the first and second sensing parts SP1 and SP2 may be less visually recognizable.

Figure 20:
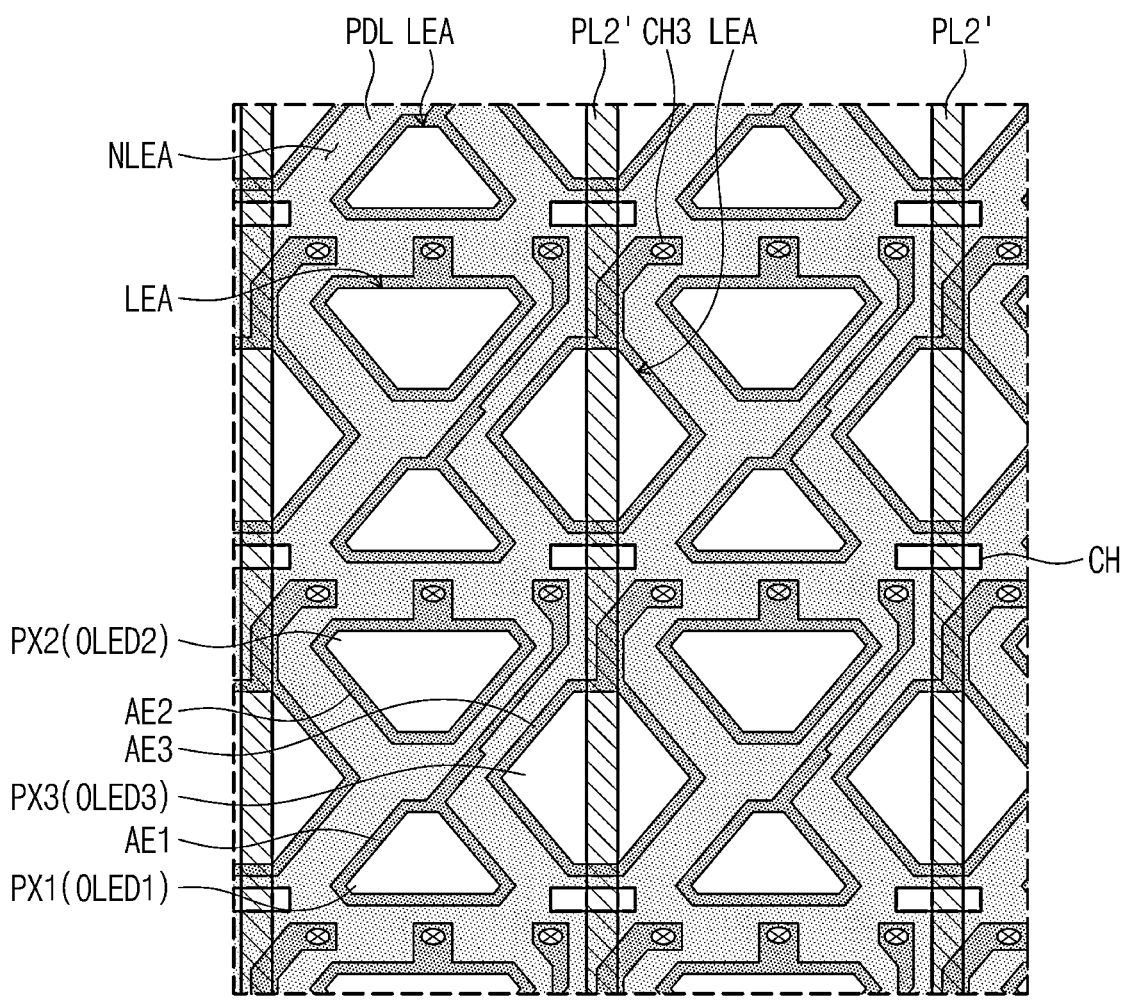
FIG. 20 is a view illustrating a planar configuration of auxiliary lines connected to a second electrode according to another embodiment of the present disclosure.
Figure 20:
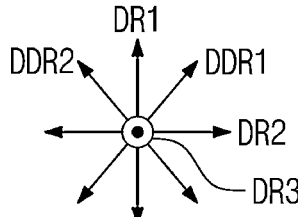
Figure 21:
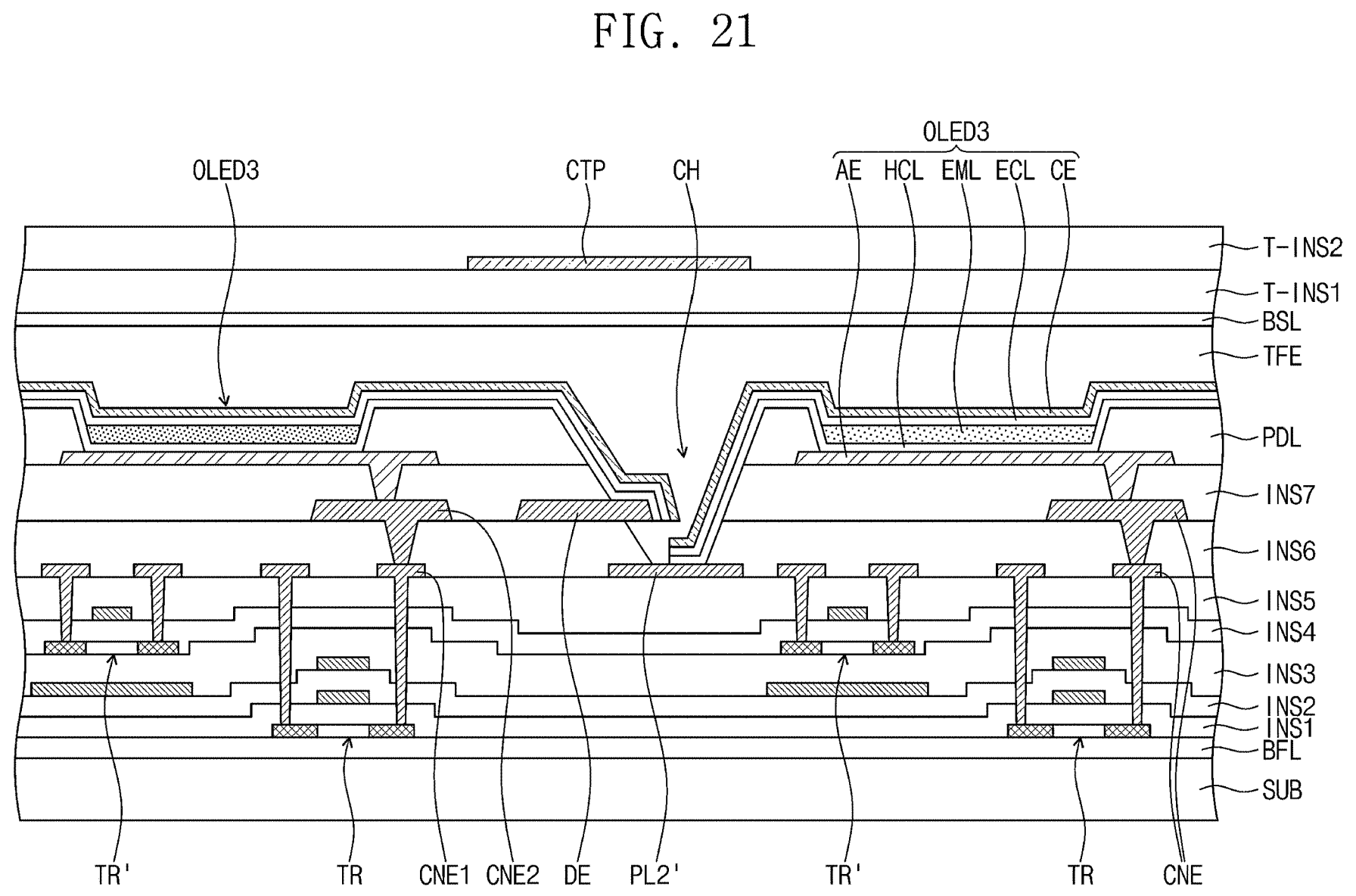

FIG. 20 is a view illustrating a planar configuration of auxiliary lines connected to a second electrode according to another embodiment of the present disclosure. FIG. 21 is a cross-sectional view schematically illustrating any one contact hole illustrated in FIG. 20 and two third light emitting elements adjacent to the any one contact hole.

For example, FIG. 20 is a plan view corresponding to FIG. 6.

Referring to FIG. 20, the display panel DP may include a plurality of auxiliary lines PL2'. The auxiliary lines PL2' may extend in the first direction DR1 and may be arranged in the second direction DR2. The auxiliary lines PL2' may extend to be overlapped with the third light emitting elements OLED3. The auxiliary lines PL2' may extend from the second power supply line PL2 disposed in the above-described non-display region NDA. Therefore, the auxiliary lines PL2' may receive the second voltage.

The contact holes CH may be formed between the third light emitting elements OLED3 in the first direction DR1. The configuration of the contact holes CH will be described in detail with reference to FIG. 21. The auxiliary lines PL2' may extend to be overlapped with the contact holes CH.

Referring to FIG. 21, the cross-sectional configuration of the light emitting elements OLED3 and the transistors TR and TR' is substantially the same as the configuration described in FIG. 5. Accordingly, the details thereof will be omitted. In addition, the first electrode AE, the second electrode CE, the light emitting layer EML, the electron control layer ECL, and the hole control layer HCL of the light emitting elements OLED3 are illustrated with the same reference numerals illustrated in FIG. 5. Hereinafter, the second electrode CE is referred to as a common electrode CE.

The conductive pattern CTP between the light emitting elements OLED3 may be disposed on the first insulating layer T-INS1. Therefore, when viewed in a plan view, the conductive pattern CTP may be overlapped with the pixel defining layer PDL interposed between the light emitting elements OLED3.

An auxiliary line PL2' may be disposed on the fifth insulating layer INS5. The auxiliary line PL2' may be disposed in the same layer as the first connection electrode CNE1. The auxiliary line PL2' may be formed by simultaneously patterning the same material as the first connection electrode CNE1. When viewed in a plan view, the auxiliary line PL2' may be overlapped with the conductive pattern CTP. The auxiliary line PL2' may be disposed under the common electrode CE. The common electrode CE may be connected to the auxiliary line PL2' under the conductive pattern CTP.

The sixth insulating layer INS6 (or the first via insulating layer) may be disposed on the auxiliary line PL2' and the fifth insulating layer INS5. The seventh insulating layer INS7 (or the second via insulating layer) may be disposed on the sixth insulating layer INS6, and the pixel defining layer PDL may be disposed on the seventh insulating layer INS7.

The contact hole CH may be formed in the pixel defining layer PDL, the seventh insulating layer INS7, and the sixth insulating layer INS6. For example, portions of the pixel defining layer PDL, the seventh insulating layer INS7, and the sixth insulating layer INS6 may be removed to form the contact hole CH. When viewed in a plan view, the contact hole CH may be overlapped with the common electrode CE and the conductive pattern CTP. The common electrode CE may be connected to the auxiliary line PL2' through the contact hole CH.

The common electrode CE may be disposed in the entire portion of the display region DA, and may extend to the non-display region NDA to be connected to the second power supply line PL2. According to an embodiment of the present disclosure, the common electrode CE may be additionally connected to the auxiliary line PL2' in the display region DA. Since the resistance is inversely proportional to the area of the conductor, the resistance of the common electrode CE may be lowered when the common electrode CE is connected to the auxiliary line PL2'.

The display panel DP may include a dummy electrode DE interposed between the sixth insulating layer INS6 and the seventh insulating layer INS7. When viewed in a plan view, the dummy electrode DE may be overlapped with the conductive pattern CTP. The dummy electrode DE may also be overlapped with the auxiliary line PL2'. The portion of the dummy electrode DE may protrude toward the contact hole CH and may be disposed in the contact hole CH. The dummy electrode DE may be disposed on the same layer as the second connection electrode CNE2. The dummy electrode DE and the second connection electrode CNE2 may be simultaneously formed by simultaneously patterning the same material.

To form the contact hole CH, portions of the pixel defining layer PDL, the seventh insulating layer INS7, and the sixth insulating layer INS6 may be removed through an etching process (e.g., dry etching). During the etching process, a portion of the sixth insulating layer INS6 under the dummy electrode DE may be removed. Such a process may be referred to as an undercut process. As illustrated in FIG. 21, a structure in which a portion of the dummy electrode DE protrudes toward the contact hole CH may be formed through the undercut process.

The hole control layer HCL and the electron control layer ECL may be disposed on a portion of the dummy electrode DE that protrudes toward the contact hole CH. In addition, the hole control layer HCL and the electron control layer ECL may be disposed on the auxiliary line PL2' exposed by the contact hole CH under the dummy electrode DE. Common layers such as the hole control layer HCL and the electron control layer ECL may be separated from each other above and under the portion of the dummy electrode DE that protrudes toward the contact hole CH.

The common electrode CE may be disposed on the portion of the dummy electrode DE that protrudes toward the contact hole CH. The common electrode CE may be disposed on the auxiliary line PL2' exposed by the contact hole CH under the dummy electrode DE. According to this configuration, a portion of the common electrode CE may be separated from the contact hole CH in the display region DA.

The common electrode CE may be disposed on the portion of the dummy electrode DE that protrudes toward the contact hole CH to cover the hole control layer HCL and the electron control layer ECL. The common electrode CE may be disposed on the auxiliary line PL2' to cover the hole control layer HCL and the electron control layer ECL, to make contact with the auxiliary line PL2'. Accordingly, the common electrode CE may be electrically connected to the auxiliary line PL2'.

A connection portion (hereinafter, referred to as a visibility portion that corresponds to the contact hole CH) between the common electrode CE and the auxiliary line PL2', which is interposed between the third light emitting elements OLED3, may be visible from the outside on the display device DD. In other words, visibility may be deteriorated. The conductive pattern CTP extends to have a larger width and is disposed on the visibility portion to cover the visibility portion. By blocking the visibility portion from being seen from the outside with the conductive pattern CTP, visibility is improved.

However, an embodiment of the present disclosure is not limited thereto. For example, the thickness of the conductive pattern CTP may be increased in a vertical direction to better block the visibility portion from being seen from the outside.

Figure 22:
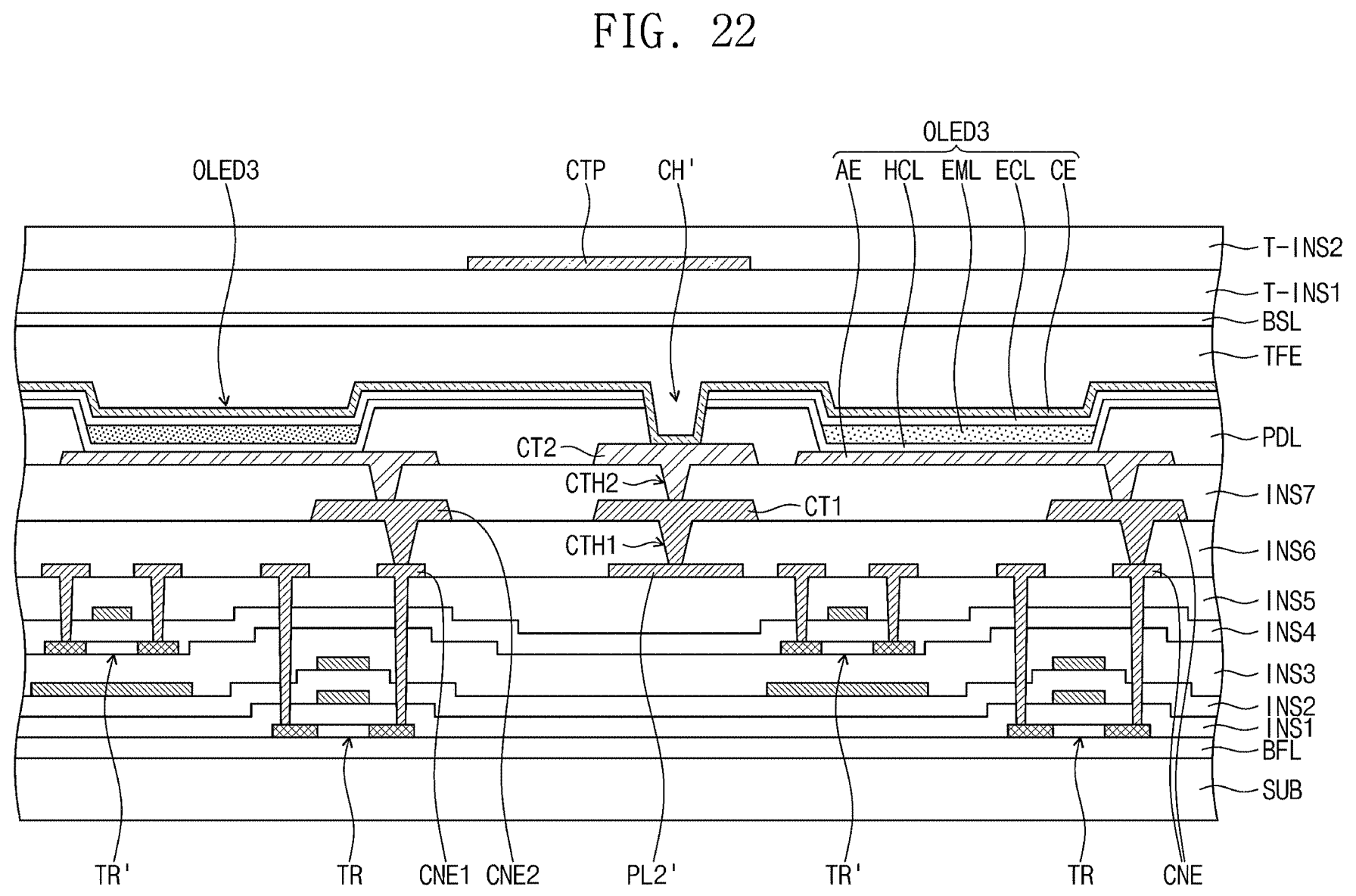

FIG. 22 is a view illustrating a connection configuration between an auxiliary line and a common electrode according to another embodiment of the present disclosure.

For example, FIG. 22 is illustrated in a cross section corresponding to FIG. 21.

Referring to FIG. 22, the auxiliary line PL2' may be disposed on the fifth insulating layer INS5, and the sixth insulating layer INS6 may be disposed on the fifth insulating layer INS5 and the auxiliary line PL2'. A connection electrode CT1 may be disposed on the sixth insulating layer INS6. When viewed in a plan view, the connection electrode CT1 may be overlapped with the conductive pattern CTP. The connection electrode CT1 may be disposed on and in the same layer as the second connection electrode CNE2. The connection electrode CT1 and the second connection electrode CNE2 may be formed by simultaneously patterning the same material.

The connection electrode CT1 may be electrically connected to the auxiliary line PL2' through a first contact hole CTH1 in the sixth insulating layer INS6. Accordingly, the connection electrode CT1 may be disposed over the auxiliary line PL2' and may be connected to the auxiliary line PL2'.

The seventh insulating layer INS7 may be disposed on the sixth insulating layer INS6 and the connection electrode CT1. Another connection electrode CT2 may be disposed on the seventh insulating layer INS7. When viewed in a plan view, the another connection electrode CT2 may be overlapped with the conductive pattern CTP. The another connection electrode CT2 may be disposed in the same layer as the first electrode AE. The another connection electrode CT2 and the first electrode AE may be formed by simultaneously patterning the same material.

The another connection electrode CT2 may be electrically connected to the connection electrode CT1 through the second contact hole CTH2 defined in the seventh insulating layer INS7. Therefore, the another connection electrode CT2 may be disposed over the connection electrode CT1 and connected to the connection electrode CT1.

The pixel defining layer PDL may be disposed on the seventh insulating layer INS7 and the another connection electrode CT2. The electronic control layer ECL, the hole control layer HCL, and the common electrode CE may be disposed on the pixel defining layer PDL.

Portions of the pixel defining layer PDL, the electronic control layer ECL, and the hole control layer HCL, which are overlapped with a portion of the another connection electrode CT2, may be removed to form the contact hole CH'. The common electrode CE may be electrically connected to the another connection electrode CT2 through the contact hole CH'. Accordingly, the common electrode CE may be disposed on the another connection electrode CT2 and connected to the another connection electrode CT2.

The common electrode CE may be connected to the second auxiliary line PL2' through the another connection electrode CT2 and the connection electrode CT1. Accordingly, the resistance of the common electrode CE may be lowered.

The connection electrodes CT1 and CT2 connecting the common electrode CE to the second auxiliary line PL2' between the third light emitting elements OLED3 may be viewed from the outside on the display device DD. In other words, visibility may be deteriorated. The conductive pattern CTP extends to have a larger width and is disposed on the connection electrodes CT1 and CT2, to cover the connection electrodes CT1 and CT2. By blocking the connection electrodes CT1 and CT2 from being seen from the outside with the conductive pattern CTP, visibility is improved.

However, an embodiment of the present disclosure is not limited thereto. For example, the thicknesses of the connection electrodes CT1 and CT2 may be increased in the vertical direction, to better block the connection electrodes CT1 and CT2 from being seen from the outside.

FIG. 23 is a view illustrating a structure of a display panel including a spacer according to another embodiment of the present disclosure. FIG. 24 is a cross-sectional view schematically illustrating any one spacer and third light emitting elements disposed with a spacer interposed therebetween in FIG. 23.

FIG. 23 is a plan view corresponding to FIG. 13A, and FIG. 24 is a cross-sectional view corresponding to FIG. 21.

Referring to FIG. 23, the conductive patterns CTP may be disposed between the third light emitting elements OLED3 arranged in some even-numbered columns C_E. At least one spacer SPC may be disposed between the third light emitting elements OLED3 arranged in other even-numbered columns C_E, instead of the conductive patterns CTP. In other words, in a row, the spacer SPC may be disposed between adjacent conductive patterns CTP.

Referring to FIGS. 23 and 24, the spacer SPC may be disposed on the pixel defining layer PDL, and the electronic control layer ECL, the hole control layer HCL, and the common electrode CE may be disposed on the spacer SPC. The spacer SPC may be disposed on a portion of the pixel defining layer PDL that has no conductive pattern CTP or contact hole CH as illustrated in FIG. 21. The spacer SPC may serve to maintain a gap of the display panel DP by increasing resistance against external pressure applied to the display panel DP.

FIGS. 25 and 26 are views illustrating a planar configuration of first and second sensing electrodes according to another embodiment of the present disclosure.

FIGS. 25 and 26 may illustrate layers corresponding to FIGS. 10 and 11, respectively.

Referring to FIG. 25, the first and second sensing electrodes SE1 and SE2 may further include a plurality of dummy patterns DMP disposed in the same layer as the connection pattern CP. The dummy patterns DMP may be spaced apart from the connection patterns CP. The dummy patterns DMP may have substantially the same shape as the first and second sensing parts SP1 and SP2. For example, the dummy patterns DMP may include dummy mesh lines DMSL and dummy conductive patterns DCTP to have a mesh shape.

Therefore, as described with reference to FIG. 13A, the dummy mesh lines DMSL may be disposed between the first and second light emitting elements OLED1 and OLED2, between the first and third light emitting elements OLED1 and OLED3, and between the second and third light emitting elements OLED2 and OLED3. In addition, the dummy conductive patterns DCTP may be disposed between the third light emitting elements OLED3 arranged in an even-numbered column.

Referring to FIGS. 25 and 26, the first and second sensing parts SP1 and SP2 and the extension pattern EP may be disposed on the connection pattern CP and the dummy patterns DMP. The dummy patterns DMP may be disposed under the first and second sensing parts SP1 and SP2 and overlapped with the first and second sensing parts SP1 and SP2, respectively, when viewed in a plan view.

A ground voltage may be applied to the dummy patterns DMP. However, the present disclosure is not limited thereto, and the dummy patterns DMP may be connected to the first and second sensing parts SP1 and SP2 through the contact holes. In addition, the present disclosure is not limited thereto, and the dummy patterns DMP may be in a floating state while being separated from peripheral conductive patterns.

According to another embodiment of the present disclosure, the input sensing part ISP may be formed by the dummy patterns DMPs and the first sensing parts SP1 arranged in the first direction DR1. For example, the dummy patterns DMP disposed on a lower layer may be connected in the first direction DR1 to be used as transmission electrodes, and the first sensing parts SP1 disposed on the upper layer may be connected in the first direction DR1 to be used as reception electrodes.

FIG. 27 is a cross-sectional view taken along line II-II' illustrated in FIG. 26.

For example, FIG. 27 is a cross-sectional view illustrating the dummy pattern DMP and the first sensing part SP1 together.

Referring to FIG. 27, the dummy mesh line DMSL of the dummy pattern DMP and the dummy conductive pattern DCTP of a dummy pattern DMP may be disposed on the base layer BSL. The first insulating layer T-INS1 may be disposed on the base layer BSL, the dummy mesh line DMSL, and the dummy conductive pattern DCTP.

The mesh line MSL and the conductive pattern CTP of the first sensing part SP1 may be disposed on the first insulating layer T-INS1. The mesh line MSL of the first sensing part SP1 may overlap the dummy mesh line DMSL, and the conductive pattern CTP of the first sensing part SP1 may overlap the dummy conductive pattern DCTP. The width of the dummy mesh line DMSL may be less than the width of the mesh line MSL. The width of the dummy conductive pattern DCTP may be less than the width of the conductive pattern CTP. In FIG. 27, the "width" may be a numerical value measured in a horizontal direction. The second insulating layer T-INS2 may be disposed on the first insulating layer T-INS1, the mesh line MSL, and the conductive pattern CTP.

FIG. 28A is a cross-sectional view illustrating the conductive pattern and the dummy conductive pattern in FIG. 27 in more detail. FIG. 28B is a view illustrating a configuration in which the conductive pattern and the dummy conductive pattern have the same width in FIG. 27.

Referring to FIG. 28A, each of the conductive pattern CTP and the dummy conductive pattern DCTP may include first metal layers M1 and a second metal layer M2 disposed between the first metal layers M1. For example, the first metal layers M1 may include titanium (Ti), and the second metal layer M2 may include aluminum (Al).

When a user USR views the conductive pattern CTP and the dummy conductive pattern DCTP from the side, since the dummy conductive pattern DCTP has a width smaller than that of the conductive pattern CTP, the dummy conductive pattern DCTP may not be viewed by the user USR.

Referring to FIG. 28B, the conductive pattern CTP and the dummy conductive pattern DCTP may have the same width. In this case, when the user USR views the conductive pattern CTP and the dummy conductive pattern DCTP from the side, the dummy conductive pattern DCTP disposed under the conductive pattern CTP may be viewed by the user USR.

According to an embodiment of the present disclosure, since the dummy conductive pattern DCTP has a width smaller than that of the conductive pattern CTP, the dummy conductive pattern DCTP may not be viewed by the user USR. For example, although the dummy conductive pattern DCTP and the conductive pattern CTP have been described, the dummy mesh line DMSL may also have a width smaller than that of the mesh line MSL, and thus, the dummy mesh line DMSL may not be viewed by the user USR.

In addition, the mesh line MSL and the conductive pattern CTP of the connection pattern CP, which are disposed in the same layer as the dummy conductive pattern DCTP and the dummy mesh line DMSL, may have smaller widths than the mesh line MSL and the conductive pattern CTP of each of the first and second sensing parts SP1 and SP2.

According to an embodiment of the present disclosure, the sensing parts include the mesh lines and the conductive patterns, with the conductive patterns may be interposed between the third light emitting elements. The area of the conductive patterns may be expanded between the third light emitting elements that are spaced apart farther apart from each other. Accordingly, the capacitance formed between sensing parts may be increased, enhancing the touch sensitivity of the input sensing part.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A display device comprising:
a display panel including a plurality of first light emitting elements and a plurality of second light emitting elements alternately arranged in a first direction in odd-numbered columns, and a plurality of third light emitting elements arranged in the first direction in even-numbered columns; and
a plurality of sensing parts disposed on the display panel, wherein each of the plurality of sensing parts includes:
a plurality of mesh lines interposed between an n-th first light emitting element and an n-th second light emitting element, between the n-th first light emitting element and an n-th third light emitting element, and between the n-th second light emitting element and the n-th third light emitting element, when viewed in a plan view, wherein 'n' is a natural number; and
a plurality of conductive patterns interposed between the third light emitting elements arranged in one even-numbered column, when viewed in the plan view, and wherein each of the conductive patterns has a width greater than a width of each of the mesh lines.

2. The display device of claim 1, wherein each of the conductive patterns has a circular shape.

3. The display device of claim 1, wherein each of the conductive patterns has a polygonal shape.

4. The display device of claim 1, wherein the mesh lines and the conductive patterns are integrally formed.

5. The display device of claim 1, wherein some mesh lines of the mesh lines are cut out.

6. The display device of claim 1, wherein in an odd-numbered column and an even-numbered column adjacent to each other, a k-th first light emitting element and a k-th second light emitting element are adjacent to each other in the first direction,
wherein a direction crossing the first direction is a second direction,
wherein in the odd-numbered column and the even-numbered column adjacent to each other, a k-th third light emitting element is adjacent to the k-th first light emitting element in a first diagonal direction, and adjacent to the k-th second light emitting element in a second diagonal direction,
wherein 'k' is a natural number,
wherein the first diagonal direction crosses the first and second directions on a plane defined by the first and second directions, and
wherein the second diagonal direction crosses the first diagonal direction when viewed on the plane.

7. The display device of claim 6, wherein a distance between the k-th first light emitting element and the k-th third light emitting element in the first diagonal direction and a distance between the k-th second light emitting element and the k-th third light emitting element in the second diagonal direction is a first distance, and
wherein a distance between the k-th first light emitting element and the k-th second light emitting element in the first direction is a second distance greater than the first distance, and
wherein a distance between the k-th third light emitting element and a (k+1)-th third light emitting element in the first direction is a third distance greater than the second distance.

8. The display device of claim 6, wherein the mesh lines include:
a plurality of first mesh lines extending in the second direction from each of the conductive patterns;
a plurality of second mesh lines extending in the first diagonal direction and the second diagonal direction from each of the conductive patterns; and
a plurality of third mesh lines extending in the second direction from contact points between the second mesh lines extending in the first diagonal direction and the second mesh lines extending in the second diagonal direction,
wherein each of the first mesh lines is interposed between the k-th first light emitting element and a (k+1)-th second light emitting element, in each of the odd-numbered columns, when viewed on the plane,
wherein the second mesh lines are interposed between the first light emitting elements and the third light emitting elements, and between the second light emitting elements and the third light emitting elements, when viewed on the plane, and
wherein each of the third mesh lines is interposed between the k-th first light emitting element and the k-th second light emitting element, in each of the odd-numbered columns, when viewed on the plane.

9. The display device of claim 8, wherein at least one first mesh line among the first mesh lines is cut out.

10. The display device of claim 8, wherein one second mesh line of the second mesh lines extending from each of the conductive patterns is cut out.

11. The display device of claim 8, wherein second mesh lines adjacent to each of even-numbered third light emitting elements among third light emitting elements arranged in even-numbered rows are cut out, and wherein the even-numbered third light emitting elements are arranged in order in the second direction, in each of the even-numbered rows.

12. The display device of claim 8, wherein second mesh lines extending from each of even-numbered conductive patterns among conductive patterns arranged in even-number rows are cut out, and wherein the even-numbered conductive patterns are arranged in order in the second direction, in each of the even-numbered rows.

13. The display device of claim 8, wherein the conductive patterns include:

a plurality of first conductive patterns arranged in the first direction and the second direction; and at least two second conductive patterns interposed between two first conductive patterns adjacent to each other in the first direction, and between two second conductive patterns adjacent to each other in the second direction, wherein first and second mesh lines extending from each of the first conductive patterns are cut out, wherein two third mesh lines adjacent to each other are not provided between the second conductive patterns interposed between the first conductive patterns adjacent to each other in the first direction, and wherein a (1-1)-th mesh line between second conductive patterns interposed between the first conductive patterns adjacent to each other in the second direction and two third mesh lines adjacent to the (1-1)-th mesh line in the first direction are cut out.

14. The display device of claim 8, wherein portions of first mesh lines and second mesh lines adjacent to a first side of each of odd-numbered conductive patterns among conductive patterns arranged in even-numbered rows or portions of first mesh lines and second mesh lines adjacent to a second side of each of the odd-numbered conductive patterns are removed, and wherein the odd-numbered conductive patterns are arranged in order in the second direction, in each of the even-numbered rows.

15. The display device of claim 1, wherein each of the first light emitting element, the second light emitting element, and the third light emitting element includes:

a first electrode;

a second electrode on the first electrode; and a light emitting layer interposed between the first electrode and the second electrode, wherein the second electrodes of the third light emitting elements are an integral-type common electrode, wherein the display panel further includes:

an auxiliary line interposed under the common electrode and connected to the common electrode, and wherein the auxiliary line is overlapped with the conductive patterns, when viewed on a plane.

16. The display device of claim 15, wherein the display panel further includes:

a first via insulating layer disposed on the auxiliary line;

a second via insulating layer disposed on the first via insulating layer; and

a pixel defining layer disposed on the second via insulating layer and in which a pixel opening is provided for arranging the light emitting layer, wherein the first electrode is disposed on the second via-insulating layer, the pixel defining layer is disposed on the first electrode, a portion of the first electrode is exposed by the pixel opening, and the common electrode is disposed on the pixel defining layer, and wherein the common electrode is connected to the auxiliary line through a contact hole in the pixel defining layer, the second via insulating layer, and the first via insulating layer to overlap each of the conductive patterns, when viewed on the plane.

17. The display device of claim 16, further comprising:

a dummy electrode interposed between the first vial insulating layer and the second via insulating layer, and overlapped with each of the conductive patterns, when viewed on the plane, wherein a portion of the dummy electrode protrudes toward the contact hole, and wherein the common electrode is disposed on a portion of the dummy electrode protruding toward the contact hole, and disposed on the auxiliary line under the dummy electrode.

18. The display device of claim 16, further comprising:

at least one spacer disposed on the pixel defining layer, between third light emitting elements arranged in another even-numbered column.

19. The display device of claim 15, wherein the display panel further includes:

a first connection electrode disposed on the auxiliary line and connected to the auxiliary line, and a second electrode disposed on the first connection electrode, disposed in the same layer as the first electrode, and connected to the first connection electrode, wherein the first connection electrode and the second connection electrode are overlapped with each of the conductive patterns, when viewed on the plane, and wherein the common electrode is disposed on the second connection electrode and connected to the second connection electrode.

20. The display device of claim 1, further comprising:

a plurality of dummy patterns disposed under the sensing parts, respectively, wherein each of the dummy patterns includes:

a plurality of dummy mesh lines interposed between the n-th first light emitting element and the n-th second light emitting element, between the n-th first light emitting element and the n-th third light emitting element, and between the n-th second light emitting element and the n-th third light emitting element, when viewed on the plane; and a plurality of dummy conductive patterns between the third light emitting elements arranged in the one even-numbered column when viewed on the plane, and wherein each of the dummy mesh lines has a width smaller than a width of each of the mesh lines, and each of the dummy conductive patterns has a width smaller than a width of each of the conductive patterns.

21. An electronic device comprising:

a display panel including a plurality of first light emitting elements and second light emitting elements alternately arranged in a h-th column, and a plurality of third light emitting elements arranged in a (h+1)-th column; and a plurality of sensing parts disposed on the display panel, wherein each of the plurality of sensing parts includes:

a plurality of mesh lines interposed between an n-th first light emitting element and an n-th second light emitting element, between the n-th first light emitting element and an n-th third light emitting element, and between the n-th second light emitting element and the n-th third light emitting element, when viewed on a plane; and a plurality of conductive patterns interposed between the third light emitting elements, when viewed on the plane, and wherein each of the conductive patterns has a width greater than a width of each of the mesh lines, and wherein each of 'h' and 'n' is a natural number.

* * * * *